United States Patent
Liang et al.

(10) Patent No.: US 9,177,876 B2
(45) Date of Patent: Nov. 3, 2015

(54) OPTICAL ABSORBERS

(71) Applicant: Intermolecular, Inc., San Jose, CA (US)

(72) Inventors: Haifan Liang, Fremont, CA (US); Jessica Eid, San Jose, CA (US); Minh Huu Le, San Jose, CA (US); Jeroen Van Duren, Palo Alto, CA (US)

(73) Assignee: Intermolecular, Inc., San Jose, CA (US)

( * ) Notice: Subject to any disclaimer, the term of this patent is extended or adjusted under 35 U.S.C. 154(b) by 0 days.

(21) Appl. No.: 14/105,797

(22) Filed: Dec. 13, 2013

(65) Prior Publication Data

US 2014/0273311 A1    Sep. 18, 2014

Related U.S. Application Data

(60) Provisional application No. 61/785,482, filed on Mar. 14, 2013.

(51) Int. Cl.
| | |
|---|---|
| *H01L 21/66* | (2006.01) |
| *H01L 31/032* | (2006.01) |
| *H01L 31/0749* | (2012.01) |

(52) U.S. Cl.
CPC ............ *H01L 22/12* (2013.01); *H01L 31/0322* (2013.01); *H01L 31/0749* (2013.01); *H01L 2924/0002* (2013.01)

(58) Field of Classification Search
USPC .......................................................... 438/16
See application file for complete search history.

(56) References Cited

U.S. PATENT DOCUMENTS

| | | | | |
|---|---|---|---|---|
| 6,048,442 | A  * | 4/2000 | Kushiya et al. | 204/192.28 |
| 8,197,703 | B2 * | 6/2012 | Basol | 216/24 |
| 2004/0063320 | A1* | 4/2004 | Hollars | 438/689 |
| 2008/0161576 | A1 | 7/2008 | Guggenheim et al. | |
| 2010/0248419 | A1 | 9/2010 | Woodruff et al. | |
| 2011/0226336 | A1* | 9/2011 | Gerbi et al. | 136/262 |
| 2011/0294254 | A1* | 12/2011 | Jackrel et al. | 438/95 |
| 2012/0313200 | A1 | 12/2012 | Jackrel et al. | |

FOREIGN PATENT DOCUMENTS

WO    WO 2008137140 A2 * 11/2008

OTHER PUBLICATIONS

Erslev et al., The electronic structure of Cu(In1—xGax)Se2 alloyed with silver, Thin Solid Films 519 (2011) 7296-7299.*

(Continued)

*Primary Examiner* — Reema Patel
*Assistant Examiner* — Syed Gheyas

(57) ABSTRACT

Optical absorbers and methods are disclosed. The methods comprise depositing a plurality of precursor layers comprising one or more of Cu, Ga, and In on a substrate, and heating the layers in a chalcogenizing atmosphere. The plurality of precursor layers can be one or more sets of layers comprising at least two layers, wherein each layer in each set of layers comprises one or more of Cu, Ga, and In exhibiting a single phase. The layers can be deposited using two or three targets selected from Ag and In containing less than 21% In by weight, Cu and Ga where the Cu and Ga target comprises less than 45% Ga by weight, Cu(In,Ga), wherein the Cu(In,Ga) target has an atomic ratio of Cu to (In+Ga) greater than 2 and an atomic ratio of Ga to (Ga+In) greater than 0.5, elemental In, elemental Cu, and $In_2Se_3$ and $In_2S_3$.

12 Claims, 14 Drawing Sheets

(56) References Cited

OTHER PUBLICATIONS

Erslev et al., 'Characterizing the effects of silver alloying in chalcopyrite CIGS solar cells with junction capacitance methods'—2009, Mater. Res. Soc. Symp. Proc. vol. 1165, 1165-M01-07.*

Park et al., 'A study on composition, structure and optical properties of copper-poor CIGS thin film deposited by sequential sputtering of CuGa/In and In/(CuGa þ In) precursors', Journal of Crystal Growth 359 (2012) 1-10.*

Boyle et al; Structural characterization of the (AgCu)(InGa)Se2 thin film alloy system for solar cells; Jan. 20, 2011; Thin Solid Films; Elsevier B.V.; pp. 7292-7295.

Tauchi et al; Characterization of (AgCu)(InGa)Se2 Absorber Layer Fabricated by Selenization Process from Metal Precursor; 5 pages.

Nakada et al; Novel Wide-Band-Gap Ag(In1-xGax)Se2 Thin Film Solar Cells; 2005; Mater. Res. Soc. Symp. Proc., vol. 865; Materials Research Society; pp. 327-334.

Lee et al.; High temperature silver—indium joints manufactured at low temperature; 2000; Thin Solid Films; Elsevier Science S.A.; pp. 196-201.

Weber et al.; Fast Cu(In,Ga)Se2 Formation by Processing Cu—In—Ga Precursors in Selenium Atmosphere; 6 pages.

Neisser et al.; Cu(In,Ga)S2 Phase Formation from Metallic Cu—In—Ga Precursor Stacks in Rapid Thermal Processes; 2001; Mater. Res. Soc. Symp. Proc., vol. 668; Materials Research Society; pp. H1.3.1-H1.3.6.

Volobujeva et al.; SEM analysis and selenization of Cu—In alloy films produced by co-sputtering of metals; 2008; Solar Energy Materials and Solar Cells; Elsevier B.V.; pp. 1-4.

Purwins et al.; Phase relations in the ternary Cu—Ga—In system; Jan. 26, 2007; Thin Solid Films; Elsevier B.V.; pp. 5895-5898.

Mainz et al.; Sulphurisation of gallium-containing thin-film precursors analysed in-situ; Dec. 19, 2006; Thin Solid Films; Elsevier B.V.; pp. 5934-5937.

* cited by examiner

OPTICAL ABSORBERS

CROSS-REFERENCE TO RELATED APPLICATION

This application claims priority to U.S. Provisional Application No. 61/785,482, filed on Mar. 14, 2013, which is herein incorporated by reference for all purposes. This application is related to U.S. patent application Ser. No. 13/595,730 filed on Aug. 27, 2012, which is herein incorporated by reference for all purposes.

FIELD OF THE INVENTION

One or more embodiments of the present invention relate to methods of manufacture of optical absorbers suitable for use in solar cells.

BACKGROUND

Optical absorbers for use with solar cells are more economically attractive if they exhibit high efficiency and can be made from thin films. Absorbers based on various combinations of at least copper, indium, gallium, and selenium ($CuIn_xGa_{1-x}Se_2$ or "CIGS") have been widely studied to meet these performance goals. CIGS has a strong absorption coefficient for visible light making it possible to use thinner absorber layers further reducing costs of assembled solar cells.

This composition is often described as having one Cu atom for every In and/or Ga atom (i.e., Cu/(In+Ga)=1, where the atomic symbols refer here to the number of each type of atom). However, high-efficiency absorbers are Cu-poor (Cu/(In+Ga)<1). For example, Weber et al. describe the preparation of a solar cell using a metallic precursor layer deposited by sputtering from a $Cu_{85}Ga_{15}$ target and an In target to produce a selenized absorber having a Cu/(In+Ga) ratio of 0.8 (Weber, A. et al. 2011 "Fast Cu(In, Ga)Se$_2$ formation by processing Cu—In—Ga precursors in selenium atmosphere" 37th IEEE Photovoltaic Specialists Conference, Seattle, Wash.; Jun. 19, 2011). Absorbers are typically also Ga-poor, having a Ga/(In+Ga) ratio<0.4.

However, Cu(In,Ga) metal precursor films (used to form CIGSe via chalcogenization) with these preferred atomic ratios are multi-phasic and tend to separate into discrete domains when deposited, especially when exposed to processing temperatures above about 155° C. This phase inhomogeneity can be observed in X-Ray diffraction and also in various microscopy techniques, such as optical microscopy, scanning electron microscopy, and atomic force microscopy (the roughness tends to go hand-in-hand with the multi-phasic nature of the film). For example, Weber et al. describe that at room temperature, the metal precursor layer contains the crystalline phases In and at least one $Cu_x(In,Ga)_y$ phase (though not clearly assigned), and that upon heating, an In melt is formed, with a resultant decreasing In/Ga ratio. This phase separation makes it difficult to form laterally uniform compositions, and after selenization, the resulting CIGS absorbers are also non-uniform, reducing the achievable open-circuit voltage and fill factor, and therefore, the overall performance (efficiency).

Attempts have been made to fabricate laterally uniform CIGS layers by physical vapor deposition (PVD) of the metals (followed by chalcogenization) by sequentially using sputtering targets such as In with alloyed sputtering targets such as $Cu_{0.75}$—$Ga_{0.25}$, $Cu_{0.60}$—$Ga_{0.40}$, or $Cu_{0.85}$—$Ga_{0.15}$ to force uniform deposition of layers having the desired composition. However, upon deposition or upon subsequent heating, the film always comes out laterally non-uniform, as indicated by optical and electron microscopy.

U.S. Patent Application Nos. 2012/0313200 to Jackrel and 2010/0248219 to Woodruff describe that even if a uniform precursor layer is deposited, the materials may flow and migrate during processing to result in a different layer uniformity, roughness, homogeneity and quality and number of crystals within the layer. These publications describe the use of particles mixed with a carrier liquid to form an ink and the ink is used to coat a substrate to form a precursor layer.

Further performance improvement in CIGS absorbers can be achieved by grading the bandgap across the thickness of the CIGS layer. As outlined above, it is challenging to control the lateral uniformity when starting from today's solutions for Cu(In,Ga) sputtering followed by chalcogenization. Controlling both lateral uniformity and compositional depth grading for CIGSe or CIGSSe, therefore, has proven even more challenging. Other CIGS growth methods try to improve the control over both lateral uniformity and compositional depth grading. For example, grading can be achieved by varying the In/Ga ratio through the thickness of the CIGSe film. This is most often done by co-evaporation which has proven to be challenging on the manufacturing floor. Similarly, the preparation of graded absorbers can be performed using chalcogenide targets. This, however, results in a decreased sputtering rate compared to metal deposition, decreasing throughput, and increasing capital expenditure, in addition to an increased cost in sputter target manufacturing compared to metal targets.

SUMMARY OF THE INVENTION

Optical absorbers in solar cells and methods of forming optical absorbers are disclosed. An optical absorber is part of a thin film stack in a solar cell. The absorber layer is a CIGS(Se) semiconductor, formed from a precursor film stack which is chalcogenized. The precursor film comprises one or more thermodynamically stable layers comprising Cu, Ga, and In, wherein at least one layer comprises a layer rich in one or more of Cu and Ag, i.e., (Cu+Ag)/(In+Ga)>1.0, wherein the overall aggregate composition of the layers forming the precursor film is 0.7<(Ag+Cu)/(In+Ga)<1.0, 0.0<Ag/(Cu+Ag)<0.3, and 0.0<Ga/(In+Ga)<0.5. In some embodiments, the overall composition of the layers forming the precursor film is 0.7<(Ag+Cu)/(In+Ga)<1.0, 0.05<Ag/(Cu+Ag)<0.3, and 0.0<Ga/(In+Ga)<0.5. The composition of Cu, Ga, and In in each layer exhibits a single phase and the phase remains substantially constant in composition and laterally uniform in composition when heated above 155° C. The precursor film stack can comprise from one to ten or more layers with the precursor film stack typically ranging from 400 nm to 800 nm in thickness. Upon chalcogenization, the precursor film forms an optical absorber that is typically from 1.0 μm to 2.5 μm in thickness.

Methods of forming an optical absorber comprise depositing a plurality of precursor layers comprising one or more of Cu, Ga, and In on a substrate to form a precursor film, and heating the layers in a chalcogenizing atmosphere to effect a chalcogenization reaction. Each layer in the plurality of precursor layers comprises one or more of Cu, Ga, and In exhibiting a single phase. The overall composition of the layers has a composition defined by atomic ratios of ((Cu+Ag)/(In+Ga))<1 and (Ga/(In+Ga))<0.5. In some embodiments, the overall composition of the layers has a composition defined by atomic ratios of 0.7<(Ag+Cu)/(In+Ga)<1.0, 0.05<Ag/(Cu+Ag)<0.3, and 0.0<Ga/(In+Ga)<0.5. In some embodiments, the plurality of layers comprises one or more sets of two or three layers. The depositing is repeated to form a precursor film of from about 400 nm to about 800 nm in thickness. The chalcogenizing atmosphere comprises one or more of S or Se. After the chalcogenization step, the precursor film forms an optical absorber that is from 1.0 μm to 2.5 μm in thickness and has a bandgap between about 1.0 eV and about 1.6 eV. The material in the precursor layers remains substantially constant in composition both laterally and throughout the thickness of each layer when heated above 155° C., preferably up to about 350° C.

In some embodiments, the depositing is performed using physical vapor deposition (PVD). In some embodiments, one or more sets of three layers are deposited using three PVD targets, wherein one PVD target comprises Ag and In having the following compositions: 1) containing less than 21% In by weight, 2) 26-35 wt % In, or 3) $AgIn_2$. A second PVD target comprises Cu and Ga, and a third PVD target comprises In. In some embodiments, the Cu and Ga target comprises less than 45% Ga by weight. The methods can further comprise grading the bandgap of the absorber layer by varying the atomic ratio of Ag to (Cu+Ag) through the thickness of the precursor film. In some embodiments, the deposition using the PVD target comprising In is performed in the presence of a chalcogen. In some embodiments, the deposition using the PVD target is performed in an inert atmosphere and the target comprising In comprises $In_2Se_3$ or $In_2S_3$.

In some embodiments, one or more sets of two layers are deposited using two PVD targets, wherein one PVD target comprises $Cu_2(In_xGa_{1-x})$, x=0.25, and one PVD target comprises In. In some embodiments, one or more sets of two layers are deposited using two PVD targets, wherein one PVD target comprises Cu(In,Ga) having an atomic ratio of Cu to (In+Ga) greater than 2 and an atomic ratio of Ga to (Ga+In) greater than 0.5, and wherein one PVD target comprises In, $In_2Se_3$ or $In_2S_3$.

In some embodiments, one or more sets of three layers are deposited using three PVD targets, wherein the three PVD targets are selected from the following: 1) one PVD target consists essentially of Cu and Ga, one PVD target comprises Cu, and one PVD target comprises $In_2Se_3$ and $In_2S_3$, wherein the layers are deposited in an inert atmosphere; or 2) one PVD target consists essentially of Cu and Ga, one PVD target comprises Cu, and one PVD target comprises In, wherein the layers comprising Cu and Ga and Cu are deposited in an inert atmosphere, and the layer comprising In is deposited in an atmosphere comprising one or more of S and Se. The methods can further comprise grading the bandgap of the absorber layer by varying a ratio of Ga to (Ga+In) through a thickness of the plurality of precursor layers after the heating. The methods can further comprise grading a bandgap of the absorber layer by varying a ratio of S to (S+Se) through a thickness of the plurality of precursor layers after the heating.

In some embodiments, methods of forming an optical absorber comprise designating a plurality of site-isolated regions (SIRs) on the substrate, depositing a plurality of layers comprising one or more of Cu, Ga, and In on a substrate using PVD to form a precursor film, heating the layers in a chalcogenizing atmosphere to effect a chalcogenization reaction, varying process parameters (e.g., annealing or PVD process parameters) among the plurality of SIRs in a combinatorial manner, and characterizing each precursor film or optical absorber formed on the discrete SIRs. In some embodiments, the process parameters comprise one or more of wt % In in Ag—In target, wt % Ga in Cu—Ga target, wt % Cu in Cu—In—Ga target, wt % Ga in Cu—In—Ga target, wt % Cu, Ag, In, and Ga in deposited film or stack of layers, sputtering power, sputtering pressure, sputtering atmosphere composition (e.g., $O_2$, $H_2Se$ or $H_2$ in addition to Ar or other noble gas), sputtering time, substrate temperature, annealing temperature and time, annealing atmosphere composition, annealing pressure, number of sets of layers, and co-deposition vs. sequential layer deposition. In some embodiments, the characterizing each precursor film or optical absorber comprises measuring a structure or performance parameter of the precursor film or optical absorber for each of the plurality of site-isolated regions. In some embodiments, the structure or performance parameter is one or more of crystallinity, grain size (distribution), lattice parameter, crystal orientation (distribution), matrix and minority composition, bandgap, bandgap grading, bulk bandgap, surface bandgap, efficiency, resistivity, carrier concentration, mobility, minority carrier lifetime, optical absorption coefficient, surface roughness, adhesion, thermal expansion coefficient, thickness, photoluminescence properties, surface photovoltage properties, haze, gloss, specular reflection, etc.

DETAILED DESCRIPTION

Figure 1:
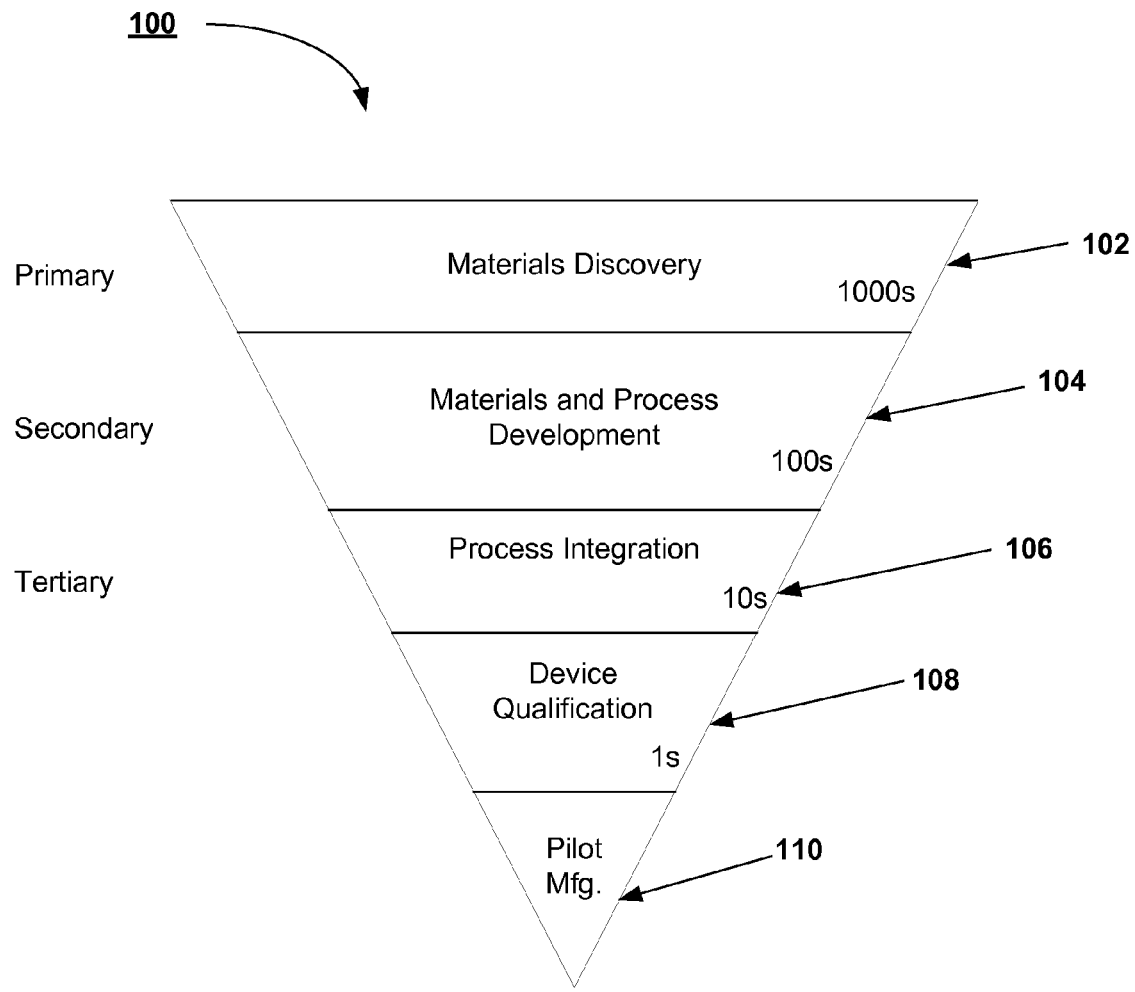
FIG. 1 is a schematic diagram for implementing combinatorial processing and evaluation.

Before the present invention is described in detail, it is to be understood that unless otherwise indicated this invention is not limited to specific semiconductor devices or to specific semiconductor materials. Exemplary embodiments will be described for solar cells, but other devices can also be fabricated using the methods disclosed. It is also to be understood that the terminology used herein is for the purpose of describing particular embodiments only and is not intended to limit the scope of the present invention.

It must be noted that as used herein and in the claims, the singular forms "a," "and" and "the" include plural referents unless the context clearly dictates otherwise. Thus, for example, reference to "a layer" includes two or more layers, and so forth.

Where a range of values is provided, it is understood that each intervening value, to the tenth of the unit of the lower limit unless the context clearly dictates otherwise, between the upper and lower limit of that range, and any other stated or intervening value in that stated range, is encompassed within the invention. The upper and lower limits of these smaller ranges may independently be included in the smaller ranges, and are also encompassed within the invention, subject to any specifically excluded limit in the stated range. Where the stated range includes one or both of the limits, ranges excluding either or both of those included limits are also included in the invention. Where the modifier "about" or "approximately" is used, the stated quantity can vary by up to 10%. Where the modifier "substantially equal to" is used, the two quantities may vary from each other by no more than 5%.

Definitions

As used herein, the term "thermodynamically stable" or "single phase" will be understood to mean that the material in the precursor layers remains substantially constant in composition both laterally and throughout the thickness of each layer when heated up to and above 155° C., preferably up to about 350° C. The stability of the stack of layers is dictated by the phase diagram of the elements involved, not the stability of one layer by itself. For example, a stack of $Cu_2(In_{0.25},Ga_{0.75})$+In is thermodynamically stable up to several hundred degrees. When a precursor layer comprises pure In (which exhibits a phase transition [solid to liquid] at 156° C.), the stack of precursor layers remains substantially constant in composition, even though the In layer melts at 156° C. Therefore, the phases are "thermodynamically stable" as a stack of layers having a constant composition in a temperature range (e.g., 25° C. to 350° C.). In addition, the composition is uniform laterally, in contrast to layers deposited using a mixture of particles or flakes, which will exhibit heterogeneity in orientation and composition. The composition in the precursor layers exhibits a single phase in metals (e.g., an In layer, or a single-phase Cu—Ga alloy layer), but can also exhibit an additional phase when the layer comprises an alkali-salt. The alkali source can be a component of the single metal phase (e.g., a single-phase In—Na compound), or a separate salt phase (e.g., NaF) embedded in the single-phase metal precursor layer (e.g. In, or single-phase Cu—Ga). Similarly, when a layer in a stack of precursor layers is deposited as a chalcogenide (rather than a metal), it exhibits a single phase.

As used herein, "CIGS" will be understood to represent the entire range of related alloys denoted by $Cu_zIn_{(1-x)}Ga_xS_{(2+w)(1-y)}Se_{(2+w)y}$, where $0.5 \leq z \leq 1.5$, $0 \leq x \leq 1$, $0 \leq y \leq 1$, $-0.2 \leq w \leq 0.5$. Similarly, as noted above, other materials (i.e. Ag, Au, Te, etc.) may be incorporated into potential absorber layers, (with e.g. Ag replacing part or all of the Cu, and Te replacing part or all of the Se and/or S). Also as mentioned previously, any of these materials may be further doped with a suitable dopant. As used herein, "CIGSSe", "CIGSe", and "CIGS" will be defined as equivalent and will be used interchangeably and will include all compositions including Cu—In—Ga—Se—S, Cu—In—Ga—Se, and Cu—In—Ga—S. Furthermore, "CIGS" also includes other IB-IIIA-VIA alloys, like (Ag,Cu)(In,Ga)(Se), or (Cu)(In,Ga)(S,Se,Te), and the like.

As used herein, the notation "(IIIA)" will be understood to represent the sum of the concentrations of all Group-IIIA elements. This notation will be used herein in calculations of the composition ratios of various elements. This notation will be understood to extend to each of the other Groups of the periodic table respectively (e.g. "(IA)", "(IIA)", "(IVA)", "(VIA)", "(IB)", "(IIB)", etc.).

As used herein, the notation "Cu—In—Ga" and "Cu(In,Ga)" will be understood to include a material containing these elements in any ratio. The notation is extendable to other materials and other elemental combinations.

As used herein, the notation "$Cu_xIn_yGa_z$" will be understood to include a material containing these elements in a specific ratio given by x, y, and z (e.g. $Cu_{75}Ga_{25}$ contains 75 atomic % Cu and 25 atomic % Ga). The notation is extendable to other materials and other elemental combinations.

As used herein, the notation "$(Ag,Cu)_x(In,Ga)_y(Se,S,Te)_z$" will be understood to include a material containing a total amount of Group-IB elements (i.e. Ag plus Cu, etc.) in a relative amount given by x, a total amount of Group-IIIA elements (i.e. In plus Ga), etc. in a relative amount given by y, and a total amount of Group-VIA elements (i.e. Se plus S plus Te, etc.) in a relative amount given by z. The notation is extendable to other materials and other elemental combinations.

As used herein, "metal chalcogenide" or "chalcogenide" will be understood to represent the entire range of related compounds denoted by "MX" where M represents one or more metal elements and X represents one or more of the chalcogen elements (e.g. O, S, Se, or Te).

As used herein, "chalcogenize" and "chalcogenization" will be understood to represent the process by which one or more metals are converted to chalcogenide compounds by exposing the one or more metals to a chalcogen (e.g. O, S, Se, or Te) at elevated temperature (e.g. between 100° C. and 700° C.). Specifically, "selenization" will be understood to represent the process by which one or more metals are converted to selenide compounds by exposing the one or more metals to a Se source at elevated temperature (e.g. between 100° C. and 700° C.). Specifically, "sulfurization" will be understood to represent the process by which one or more metals are converted to sulfide compounds by exposing the one or more metals to a S source at elevated temperature (e.g. between 100° C. and 700° C.). In addition, "chalcogenize" or "chalcogenization" will be understood to represent the process by which a metal precursor is either partially or completely converted to the final multinary chalcogenide compound(s). Similarly, "chalcogenize" or "chalcogenization" will be understood to represent the process by which a precursor containing one or more chalcogenide materials with/without one or more elemental or alloy metals is converted to one or more dense, polycrystalline, desired multinary chalcogenide compound(s). It should be understood that the majority of the final film contains the desired multinary chalcogenide compound(s), yet a minority of the material might not be converted to the desired multinary chalcogenide compound(s).

As used herein, the terms "film" and "layer" will be understood to represent a portion of a stack. They will be understood to cover both a single layer as well as a multilayered structure (i.e. a nanolaminate). As used herein, these terms will be used synonymously and will be considered equivalent.

As used herein, "single grading" and "single gradient" will be understood to describe cases wherein a parameter varies throughout the thickness of a film or layer and further exhibits a smooth, quasilinear variation. Examples of suitable parameters used herein will include the atomic concentration of a specific elemental species (i.e. composition variation) throughout the thickness of a film or layer, and bandgap energy variation throughout the thickness of a film or layer.

As used herein, "double grading" and "double gradient" will be understood to describe cases wherein a parameter varies throughout the thickness of a film or layer and further exhibits a variation wherein the value of the parameter is smaller toward the middle of the film or layer with respect to either end of the film or layer. It is not a requirement that the value of the parameter be equivalent at the two ends of the film or layer. Examples of suitable parameters used herein will include the atomic concentration of a specific elemental species (i.e. composition variation) throughout the thickness of a film or layer, and bandgap energy variation throughout the thickness of a film or layer.

As used herein, "substrate configuration" will be understood to describe cases wherein the TFPV stack is built sequentially on top of a substrate and the light is assumed to be incident upon the top of the TFPV stack. As used herein, an "n-substrate" configuration will be used to denote that the n-type layer (i.e. buffer layer) is closest to the incident light. The n-substrate configuration is the most common. As used herein, a "p-substrate" configuration will be used to denote that the p-type layer (i.e. absorber layer) is closest to the incident light.

As used herein, "superstrate configuration" will be understood to describe cases wherein the substrate faces the incident sunlight. The convention will be used wherein light is assumed to be incident upon the substrate. As used herein, an "n-superstrate" configuration will be used to denote that the n-type layer (i.e. buffer layer) is closest to the incident light. As used herein, a "p-superstrate" configuration will be used to denote that the p-type layer (i.e. absorber layer) is closest to the incident light.

As used herein, "substrate" will be understood to generally be one of float glass, low-iron glass, borosilicate glass, flexible glass, specialty glass for high temperature processing, stainless steel, carbon steel, aluminum, copper, titanium, molybdenum, polyimide, plastics, cladded metal foils, etc. Furthermore, the substrates may be processed in many configurations such as single substrate processing, multiple substrate batch processing, in-line continuous processing, roll-to-roll processing, etc. in all of the methods and examples described herein.

As used herein, "precursor layer", "precursor material", "metal precursor layer", "metal precursor material", etc. will be understood to be equivalent and be understood to refer to a metal, metal alloy, metal chalcogenide, etc. layer and/or material that is first deposited and will ultimately become the absorber layer of the TFPV device after full chalcogenization and/or further processing.

As used herein, "absorber layer", "absorber material", and "optical absorber" etc. will be understood to be equivalent and be understood to refer to a layer and/or material that is responsible for the charge generation in the TFPV device after full chalcogenization and/or further processing.

As used herein, the notations "Al:ZnO" and "ZnO:Al" will be understood to be equivalent and will describe a material wherein the base material is the metal oxide and the element separated by the colon, ":", is considered a dopant. In this example, Al is a dopant in a base material of zinc oxide. The notation is extendable to other materials and other elemental combinations.

As used herein, a "bandgap-increasing metal" will be understood to be a metal element that increases the bandgap when substituted for an element from the same periodic table Group in the absorber material. For example, substituting Ag for a portion of the Cu in a CIGS material will increase the bandgap. For example, increasing the relative amount of Ga versus indium in a CIGS material will increase the bandgap. For example, increasing the relative amount of S versus Se in a CIGS material will increase the bandgap.

In various FIGs. below, a TFPV material stack is illustrated using a simple planar structure. Those skilled in the art will appreciate that the description and teachings to follow can be readily applied to any simple or complex TFPV solar cell structure (e.g. a stack with (non-)conformal non-planar layers for optimized photon management). The drawings are for illustrative purposes only and do not limit the application of the present invention.

"Double grading" the bandgap of the CIGS absorber is a method known in the art to increase the efficiency of CIGS solar cells. In a CIGS absorber layer that has a double-graded bandgap profile, the bandgap of the CIGS layer increases toward the front surface and toward the back surface of the CIGS layer, with a bandgap minimum located in a center region of the CIGS layer. Double grading helps in reducing unwanted charge carrier recombination. The increasing bandgap profile at the back surface of the CIGS layer, (i.e., the absorber surface that is remote from the incident light in the substrate configuration), creates a back surface field, which reduces recombination at the back surface and enhances carrier collection. Generally, in the disclosure to follow, the description will apply to the "n-substrate" configuration for economy of language. However, those skilled in the art will understand that the disclosure is also equally applicable to either of the "p-substrate" or "n, p-superstrate" configurations discussed previously.

The efficiency of thin-film photovoltaic (TFPV) devices depends on many properties of the absorber layer and the buffer layer such as crystallinity, grain size, composition uniformity, density, defect concentration, doping level, surface roughness, etc.

The manufacture of TFPV devices entails the integration and sequencing of many unit processing steps. As an example, TFPV manufacturing typically includes a series of processing steps such as cleaning, surface preparation, deposition, patterning, etching, thermal annealing, and other related unit processing steps. The precise sequencing and integration of the unit processing steps enables the formation of functional devices meeting desired performance metrics such as efficiency, power production, and reliability.

The development of TFPV devices exploiting polycrystalline, multinary compound semiconductors represents a daunting challenge in terms of the time-to-commercialization. That same development also suggests an enticing opportunity for breakthrough discoveries. A quaternary system such as CIGS requires management of multiple kinetic pathways, thermodynamic phase equilibrium considerations, defect chemistries, and interfacial control. The vast phase-space to be managed includes process parameters, source material choices, compositions, and overall integration schemes. The complexity of the intrinsically-doped, self-compensating, multinary, polycrystalline, queue-time-sensitive, thin-film absorber (CIGS), and its interfaces to up-, and down-stream processing, combined with the lack of knowledge on a device level to address efficiency losses effectively, makes it a highly empirical material system. The performance of any thin-film, (opto-)electronically-active device is extremely sensitive to its interfaces. Interface engineering for electronically-active devices is highly empirical. Traditional R&D methods are ill-equipped to address such complexity, and the traditionally slow pace of R&D could limit any new material from reaching industrial relevance when having to compete with the incrementally improving performance of already established TFPV fabrication lines, and continuously decreasing panel prices for more traditional cSi PV technologies.

Due to the complexity of the material, cell structure, and manufacturing process, both the fundamental scientific understanding and large scale manufacturability are yet to be realized for TFPV devices. As the photovoltaic industry pushes to achieve grid parity, much faster and broader investigation is needed to explore the material, device, and process windows for higher efficiency and a lower cost of manufacturing process. Efficient methods for forming different types of TFPV devices that can be evaluated are necessary.

In light of the above, there is a need in the art for an economical method of creating CIGS absorber layers having a graded bandgap and higher efficiencies. Improved layer quality and a graded bandgap enable higher efficiency CIGS solar cells to be made.

As part of the discovery, optimization and qualification of each unit process, it is desirable to be able to i) test different materials, ii) test different processing conditions within each unit process module, iii) test different sequencing and integration of processing modules within an integrated processing tool, iv) test different sequencing of processing tools in executing different process sequence integration flows, and combinations thereof in the manufacture of devices such as TFPV devices. In particular, there is a need to be able to test i) more than one material, ii) more than one processing condition, iii) more than one sequence of processing conditions, iv) more than one process sequence integration flow, and combinations thereof, collectively known as "combinatorial process sequence integration", on a single substrate without the need of consuming the equivalent number of monolithic substrates per material(s), processing condition(s), sequence (s) of processing conditions, sequence(s) of processes, and combinations thereof. This can greatly improve both the speed and reduce the costs associated with the discovery, implementation, optimization, and qualification of material (s), process(es), and process integration sequence(s) required for manufacturing.

Systems and methods for High Productivity Combinatorial (HPC) processing are described in U.S. Pat. No. 7,544,574 filed on Feb. 10, 2006, U.S. Pat. No. 7,824,935 filed on Jul. 2, 2008, U.S. Pat. No. 7,871,928 filed on May 4, 2009, U.S. Pat. No. 7,902,063 filed on Feb. 10, 2006, and U.S. Pat. No. 7,947,531 filed on Aug. 28, 2009 which are all herein incorporated by reference. Systems and methods for HPC processing are further described in U.S. patent application Ser. No. 11/352,077 filed on Feb. 10, 2006, claiming priority from Oct. 15, 2005, U.S. patent application Ser. No. 11/419,174 filed on May 18, 2006, claiming priority from Oct. 15, 2005, U.S. patent application Ser. No. 11/674,132 filed on Feb. 12, 2007, claiming priority from Oct. 15, 2005, and U.S. patent application Ser. No. 11/674,137 filed on Feb. 12, 2007, claiming priority from Oct. 15, 2005 which are all herein incorporated by reference.

HPC processing techniques have been successfully adapted to wet chemical processing such as etching, texturing, polishing, cleaning, etc. HPC processing techniques have also been successfully adapted to deposition processes such as sputtering, atomic layer deposition (ALD), and chemical vapor deposition (CVD).

HPC processing techniques have been adapted to the development and investigation of absorber layers and buffer layers for TFPV solar cells as described in U.S. application Ser. No. 13/236,430 filed on Sep. 19, 2011, entitled "COMBINATORIAL METHODS FOR DEVELOPING SUPERSTRATE THIN FILM SOLAR CELLS" and is incorporated herein by reference. However, HPC processing techniques have not been successfully adapted to the development of contact structures for TFPV devices. Generally, there are two basic configurations for TFPV devices. The first configuration is known as a "substrate" configuration. In this configuration, the contact that is formed on or near the substrate is called the back contact. In this configuration, the light is incident on the TFPV device from the top of the material stack (i.e. the side opposite the substrate). CIGS TFPV devices are most commonly manufactured in this configuration. The second configuration is known as a "superstrate" configuration. In this configuration, the contact that is formed on or near the substrate is called the front contact. In this configuration, the light is incident on the TFPV device through the substrate. CdTe, and a-Si, TFPV devices are most commonly manufactured in this configuration. In both configurations, light trapping schemes may be implemented in the contact layer that is formed on or near the substrate. Additionally, other efficiency or durability improvements can be implemented in the contact layer that is formed farthest away from the substrate.

FIG. 1 illustrates a schematic diagram, 100, for implementing combinatorial processing and evaluation using primary, secondary, and tertiary screening. The schematic diagram, 100, illustrates that the relative number of combinatorial processes run with a group of substrates decreases as certain materials and/or processes are selected. Generally, combinatorial processing includes performing a large number of processes during a primary screen, selecting promising candidates from those processes, performing the selected processing during a secondary screen, selecting promising candidates from the secondary screen for a tertiary screen, and so on. In addition, feedback from later stages to earlier stages can be used to refine the success criteria and provide better screening results.

For example, thousands of materials are evaluated during a materials discovery stage, 102. Materials discovery stage, 102, is also known as a primary screening stage performed using primary screening techniques. Primary screening techniques may include dividing substrates into coupons and depositing materials using varied processes. The materials are then evaluated, and promising candidates are advanced to the secondary screen, or materials and process development stage, 104. Evaluation of the materials is performed using metrology tools such as electronic testers and imaging tools (i.e., microscopes).

The materials and process development stage, 104, may evaluate hundreds of materials (i.e., a magnitude smaller than the primary stage) and may focus on the processes used to deposit or develop those materials. Promising materials and processes are again selected, and advanced to the tertiary screen or process integration stage, 106, where tens of materials and/or processes and combinations are evaluated. The tertiary screen or process integration stage, 106, may focus on integrating the selected processes and materials with other processes and materials.

The most promising materials and processes from the tertiary screen are advanced to device qualification, 108. In device qualification, the materials and processes selected are evaluated for high volume manufacturing, which normally is conducted on full substrates within production tools, but need not be conducted in such a manner. The results are evaluated to determine the efficacy of the selected materials and processes. If successful, the use of the screened materials and processes can proceed to pilot manufacturing, 110.

The schematic diagram, 100, is an example of various techniques that may be used to evaluate and select materials and processes for the development of new materials and processes. The descriptions of primary, secondary, etc. screening and the various stages, 102-110, are arbitrary and the stages may overlap, occur out of sequence, be described and be performed in many other ways.

This application benefits from High Productivity Combinatorial (HPC) techniques described in U.S. patent application Ser. No. 11/674,137 filed on Feb. 12, 2007 which is hereby incorporated for reference in its entirety. Portions of the '137 application have been reproduced below to enhance the understanding of the present invention. The embodiments described herein enable the application of combinatorial techniques to process sequence integration in order to arrive at a globally optimal sequence of TFPV manufacturing operations by considering interaction effects between the unit manufacturing operations, the process conditions used to effect such unit manufacturing operations, hardware details used during the processing, as well as materials characteristics of components utilized within the unit manufacturing operations. Rather than only considering a series of local optimums, i.e., where the best conditions and materials for each manufacturing unit operation is considered in isolation, the embodiments described below consider interactions effects introduced due to the multitude of processing operations that are performed and the order in which such multitude of processing operations are performed when fabricating a TFPV device. A global optimum sequence order is therefore derived and as part of this derivation, the unit processes, unit process parameters and materials used in the unit process operations of the optimum sequence order are also considered.

The embodiments described further analyze a portion or sub-set of the overall process sequence used to manufacture a TFPV device. Once the subset of the process sequence is identified for analysis, combinatorial process sequence integration testing is performed to optimize the materials, unit processes, hardware details, and process sequence used to build that portion of the device or structure. During the processing of some embodiments described herein, structures are formed on the processed substrate that are equivalent to the structures formed during actual production of the TFPV device. For example, such structures may include, but would not be limited to, contact layers, buffer layers, absorber layers, or any other series of layers or unit processes that create an intermediate structure found on TFPV devices. While the combinatorial processing varies certain materials, unit processes, hardware details, or process sequences, the composition or thickness of the layers or structures or the action of the unit process, such as cleaning, surface preparation, deposition, surface treatment, etc. is substantially uniform through each discrete region. Furthermore, while different materials or unit processes may be used for corresponding layers or steps in the formation of a structure in different regions of the substrate during the combinatorial processing, the application of each layer or use of a given unit process is substantially consistent or uniform throughout the different regions in which it is intentionally applied. Thus, the processing is uniform within a region (inter-region uniformity) and between regions (intra-region uniformity), as desired. It should be noted that the process can be varied between regions, for example, where a thickness of a layer is varied or a material may be varied between the regions, etc., as desired by the design of the experiment.

The result is a series of regions on the substrate that contain structures or unit process sequences that have been uniformly applied within that region and, as applicable, across different regions. This process uniformity allows comparison of the properties within and across the different regions such that the variations in test results are due to the varied parameter (e.g., materials, unit processes, unit process parameters, hardware details, or process sequences) and not the lack of process uniformity. In the embodiments described herein, the positions of the discrete regions on the substrate can be defined as needed, but are preferably systematized for ease of tooling and design of experimentation. In addition, the number, variants and location of structures within each region are designed to enable valid statistical analysis of the test results within each region and across regions to be performed.

Figure 2:
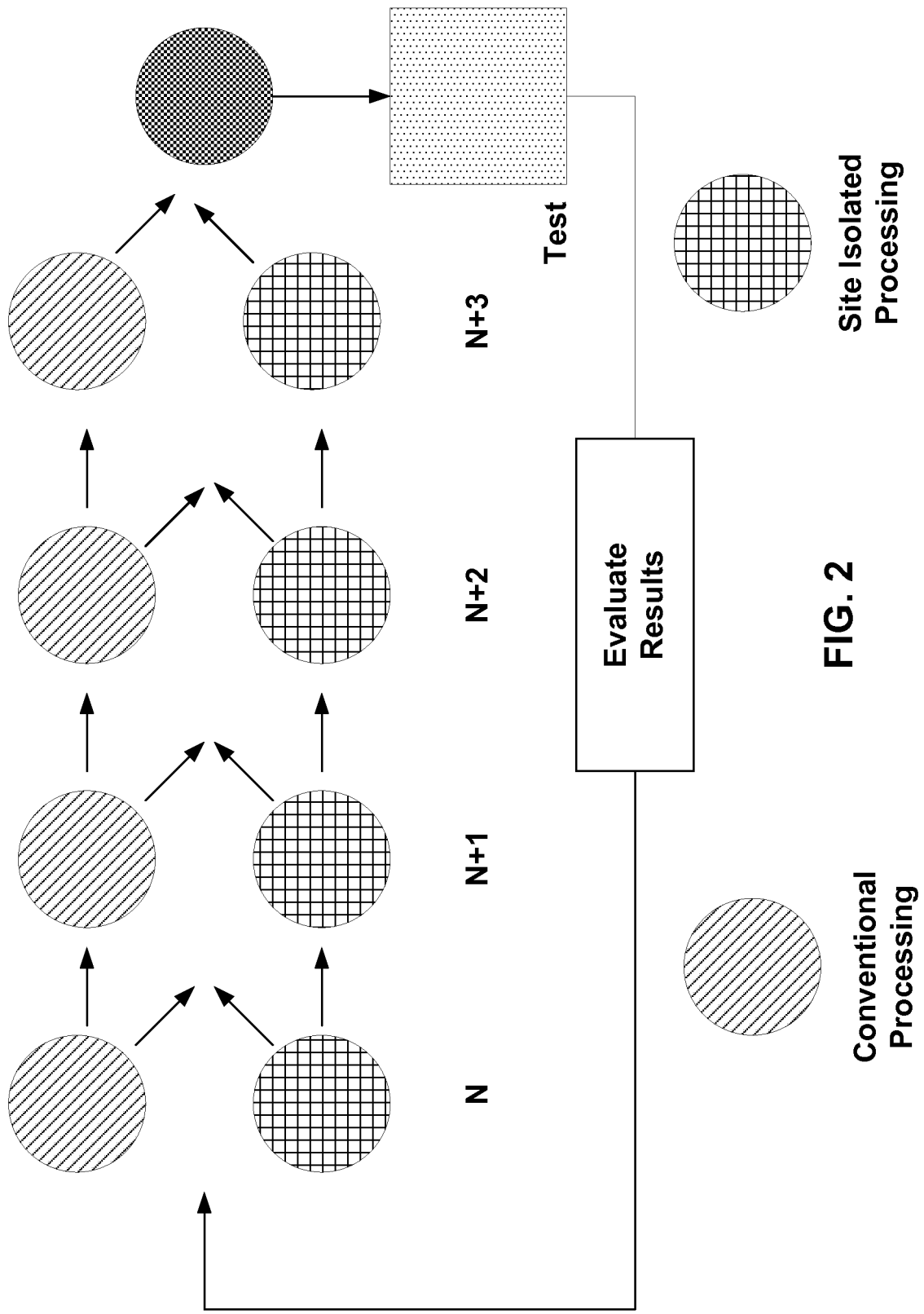
FIG. 2 is a schematic diagram for illustrating various process sequences using combinatorial processing and evaluation.

FIG. 2 is a simplified schematic diagram illustrating a general methodology for combinatorial process sequence integration that includes site isolated processing and/or conventional processing in accordance with one embodiment of the invention. In one embodiment, the substrate is initially processed using conventional process N. In one exemplary embodiment, the substrate is then processed using site isolated process N+1. During site isolated processing, an HPC module may be used, such as the HPC module described in U.S. patent application Ser. No. 11/352,077 filed on Feb. 10, 2006. The substrate can then be processed using site isolated process N+2, and thereafter processed using conventional process N+3. Testing is performed and the results are evaluated. The testing can include physical, chemical, acoustic, magnetic, electrical, optical, etc. tests. From this evaluation, a particular process from the various site isolated processes (e.g. from steps N+1 and N+2) may be selected and fixed so that additional combinatorial process sequence integration may be performed using site isolated processing for either process N or N+3. For example, a next process sequence can include processing the substrate using site isolated process N, conventional processing for processes N+1, N+2, and N+3, with testing performed thereafter.

It should be appreciated that various other combinations of conventional and combinatorial processes can be included in the processing sequence with regard to FIG. 2. That is, the combinatorial process sequence integration can be applied to any desired segments and/or portions of an overall process flow. The combinatorial processing may employ uniform processing of site isolated regions or may employ gradient techniques. Characterization, including physical, chemical, acoustic, magnetic, electrical, optical, etc. testing, can be performed after each process operation, and/or series of process operations within the process flow as desired. The feedback provided by the testing is used to select certain materials, processes, process conditions, and process sequences and eliminate others. Furthermore, the above flows can be applied to entire monolithic substrates, or portions of monolithic substrates such as coupons.

Under combinatorial processing operations the processing conditions at different regions can be controlled independently. Consequently, process material amounts, reactant species, processing temperatures, processing times, processing pressures, processing flow rates, processing powers, processing reagent compositions, the rates at which the reactions are quenched, deposition order of process materials, process sequence steps, hardware details, etc., can be varied from region to region on the substrate. Thus, for example, when exploring materials, a processing material delivered to a first and second region can be the same or different. If the processing material delivered to the first region is the same as the processing material delivered to the second region, this processing material can be offered to the first and second regions on the substrate at different concentrations. In addition, the material can be deposited under different processing parameters. Parameters which can be varied include, but are not limited to, process material amounts, reactant species, processing temperatures, processing times, processing pressures, processing flow rates, processing powers, processing reagent compositions, the rates at which the reactions are quenched, atmospheres in which the processes are conducted, an order in which materials are deposited, hardware details of the gas distribution assembly, etc. It should be appreciated that these process parameters are exemplary and not meant to be an exhaustive list as other process parameters commonly used in TFPV manufacturing may be varied.

As mentioned above, within a region, the process conditions are substantially uniform. That is, the embodiments, described herein locally perform the processing in a conventional manner, e.g., substantially consistent and substantially uniform, while globally over the substrate, the materials, processes, and process sequences may vary. Thus, the testing will find optimums without interference from process variation differences between processes that are meant to be the same. However, in some embodiments, the processing may result in a gradient within the regions. It should be appreciated that a region may be adjacent to another region in one embodiment or the regions may be isolated and, therefore, non-overlapping. When the regions are adjacent, there may be a slight overlap wherein the materials or precise process interactions are not known, however, a portion of the regions, normally at least 50% or more of the area, is uniform and all testing occurs within that region. Further, the potential overlap is only allowed with material of processes that will not adversely affect the result of the tests. Both types of regions are referred to herein as regions or discrete regions.

Figure 3:
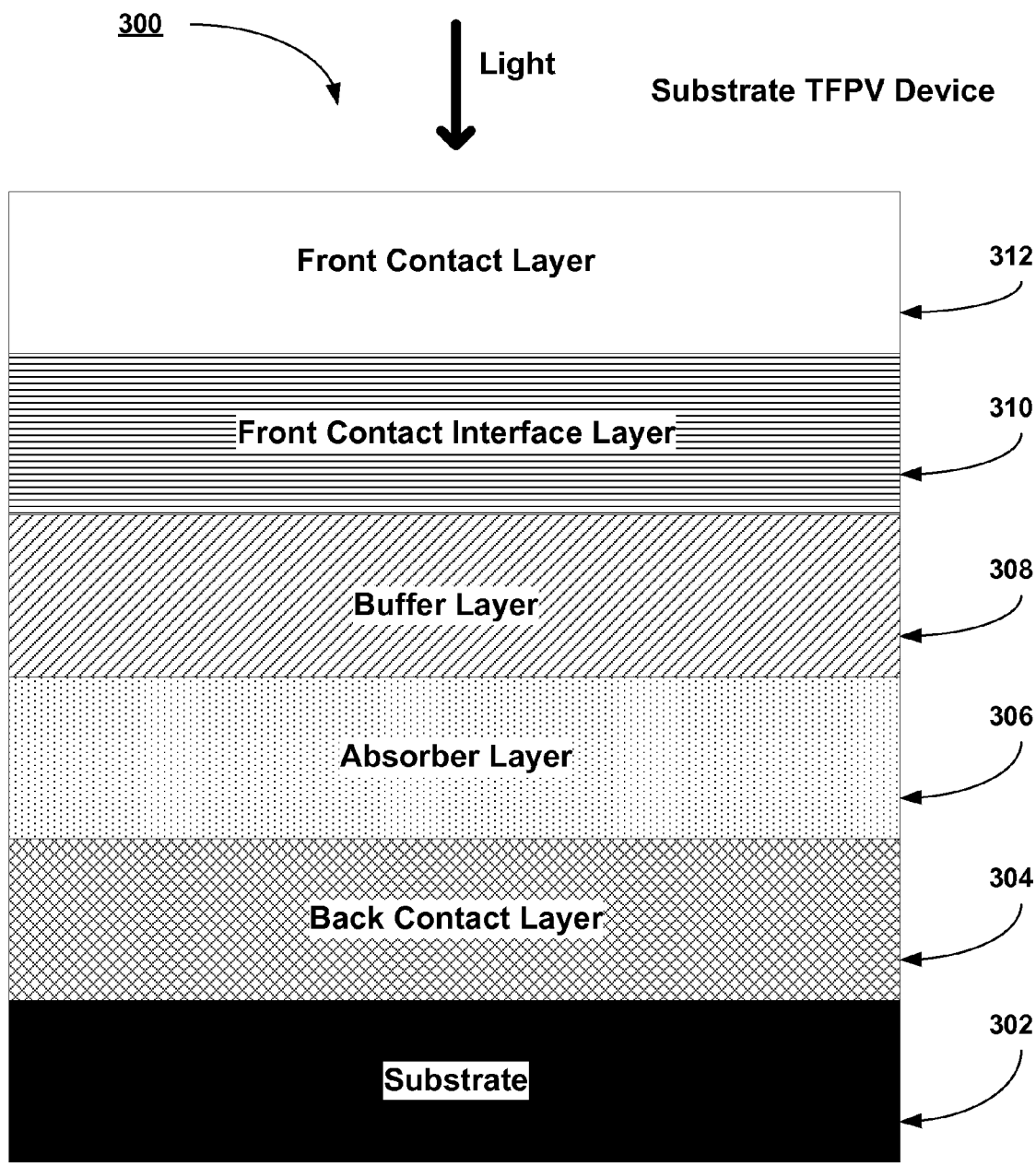
FIG. 3 illustrates a schematic diagram of a simple substrate thin film photovoltaic (TFPV) stack according to an embodiment described herein.

FIG. 3 illustrates a schematic diagram of a simple TFPV device stack in the substrate configuration consistent with some embodiments of the present invention. The convention will be used wherein light is assumed to be incident upon the top of the material stack in the substrate configuration as illustrated. This generic diagram would be typical of a CIGS TFPV device. A back contact layer, 304, is formed on a substrate, 302. Examples of suitable substrates comprise float glass, low-iron glass, borosilicate glass, flexible glass, specialty glass for high temperature processing, stainless steel, carbon steel, aluminum, copper, titanium, molybdenum, polyimide, plastics, cladded metal foils, etc. Furthermore, the substrates may be processed in many configurations such as single substrate processing, multiple substrate batch processing, in-line continuous processing, roll-to-roll processing, etc. As used herein, the phrase "back contact" will be understood to be the primary current conductor layer situated between the substrate and the absorber layer in a substrate configuration TFPV device. An example of a common back contact layer material is Mo for CIGS TFPV devices. Other types of TFPV devices use different materials for the back contact. As an example, Cu-based materials such as Cu/Au, Cu/graphite, Cu/Mo, Cu:ZnTe/Mo, etc. are typically used for CdTe TFPV devices and transparent conductive oxide (TCO) materials such as ZnO, ITO, $SnO_2$:F, etc. are typically used for a-Si TFPV devices. The back contact layer may be formed by any number of deposition technologies. Examples of suitable deposition technologies comprise physical vapor deposition (PVD) (e.g. sputtering), evaporation, chemical vapor deposition (CVD), atomic layer deposition (ALD), plating, printing, wet coating, etc. The thickness of the back contact layer is typically between about 0.3 um and about 1.0 um. The back contact layer has a number of requirements such as high conductivity, good ohmic contact to the absorber layer, ease of bonding to tabs for external connectivity, ease of scribing or other removal, good thermo-mechanical stability, and chemical resistance during subsequent processing, among others.

Optionally, a diffusion barrier and/or adhesion-promotion layer (not shown) may be formed between the substrate and the back contact layer. When implemented, the diffusion barrier layer stops the diffusion of impurities from the substrate into the back contact layer, or alternatively, stops the diffusion and reaction of the back contact material with the substrate. Examples of common diffusion barrier and/or adhesion-promotion layers comprise chromium, vanadium, tungsten, nitrides such as tantalum nitride, tungsten nitride, titanium nitride, silicon nitride, zirconium nitride, hafnium nitride, oxy-nitrides such as tantalum oxy-nitride, tungsten oxy-nitride, titanium oxy-nitride, silicon oxy-nitride, zirconium oxy-nitride, hafnium oxy-nitride, oxides such as aluminum oxide, silicon oxide, carbides such as silicon carbide, binary and/or multinary compounds of tungsten, titanium, molybdenum, chromium, vanadium, tantalum, hafnium, zirconium, and/or niobium with/without the inclusion of nitrogen and/or oxygen. The diffusion barrier layer may be formed, partially or completely, from any well known technique such as sputtering, ALD, CVD, evaporation, wet methods such as printing or spraying of inks, screen printing, inkjet printing, slot die coating, gravure printing, wet chemical depositions, or from sol-gel methods, such as the coating, drying, and firing of polysilazanes.

A p-type absorber layer, 306, of CIGS is then deposited on top of the back contact layer. The absorber layer may be formed, partially or completely, using a variety of techniques such as PVD (sputtering), co-evaporation, in-line evaporation, plating, printing or spraying of inks, screen printing, inkjet printing, slot die coating, gravure printing, wet chemical depositions, CVD, etc. Advantageously, the absorber layer is deficient in Cu. The Cu deficiency may be controlled by managing the deposition conditions. Advantageously, a small amount of Na is present during the absorber growth. The Na may be added by out-diffusion from the SLG substrate or may be purposely added in the form of $Na_2Se$, NaF, sodium alloys of In and/or Ga, or another Na source, prior, during, or after the deposition and/or growth of the absorber layer. Optionally, the absorber layer is deposited as a precursor layer that undergoes a selenization process after formation to convert the precursor to CIGS into a high-quality CIGS semiconductor film. The selenization process involves the exposure of the precursor and/or absorber layer to $H_2Se$, $H_2S$, Se vapor, S vapor, or diethylselenide (DESe) at temperatures most typically between about 300° C. and 700° C. It should be noted that the precursor to CIGS might already contain a chalcogen source (e.g. Se), either as a separate layer, or incorporated into the bulk of the precursor layer. The precursor film can be a stack of layers, or one layer. The precursor layer can be dense, or porous. The precursor film typically contains Cu, In, and Ga. The precursor layer is most commonly deposited by sputtering from e.g. binary copper-gallium and Indium sputter targets. Nevertheless, plating and printing to deposit the metal precursor film containing Cu, In, and/or Ga are used as well. During the selenization process, a layer of $Mo(S,Se)_2$ (not shown) forms at the back contact/absorber layer interface and forms a fairly good ohmic contact between the two layers. Alternatively, a layer of $Mo(S,Se)_2$ (not shown) can be deposited at the back contact/absorber layer interface using a variety of well known techniques such as PVD (sputtering), CBD, ALD, plating, etc. The thickness of the absorber layer is typically between about 1.0 μm and about 3.0 μm. The performance of the absorber layer is sensitive to materials properties such as crystallinity, grain size, surface roughness, composition, defect concentration, etc. as well as processing parameters such as temperature, deposition rate, thermal treatments, etc.

An n-type buffer layer, 308, is then deposited on top of the absorber layer. Examples of suitable n-type buffer layers comprise CdS, ZnS, $In_2S_3$, $In_2(S,Se)_3$, (Cd,Zn)S, ZnO, Zn(O, S), (Zn,Mg)O, etc. CdS is the material most often used as the n-type buffer layer in CIGS TFPV devices. The buffer layer may be deposited using chemical bath deposition (CBD), chemical surface deposition (CSD), PVD (sputtering), printing, plating, ALD, Ion-Layer-Gas-Reaction (ILGAR), ultrasonic spraying, or evaporation. The thickness of the buffer layer is typically between about 30 nm and about 100 nm. The performance of the buffer layer is sensitive to materials properties such as crystallinity, grain size, surface roughness, composition, defect concentration, etc. as well as processing parameters such as temperature, deposition rate, thermal treatments, etc.

Optionally, an intrinsic ZnO (iZnO) layer, 310, is then formed on top of the buffer layer. The iZnO layer is a high resistivity material and forms part of the transparent conductive oxide (TCO) stack that serves as part of the front contact structure. Other resistive metal oxides like $SnO_2$, resistive ZnO:Al, resistive In—Ga—Zn—O, etc. might be used instead of i-ZnO. The TCO stack is formed from transparent conductive metal oxide materials and collects charge across the face of the TFPV solar cell and conducts the charge to tabs used to connect the solar cell to external loads. The iZnO layer makes the TFPV solar cell less sensitive to lateral non-uniformities caused by differences in composition or defect concentration in the absorber and/or buffer layers. The iZnO layer is typically between about 0 nm and 150 nm in thickness. The iZnO layer is typically formed using a (reactive) PVD (sputtering) technique or CVD technique, but can be deposited by plating or printing as well. A low resistivity top TCO layer, 312, (examples include Al:ZnO (AZO), (In,Sn)O (ITO), (In,Zn)O, B:ZnO, Ga:ZnO, F:ZnO, $F:SnO_2$, etc.) is formed on top of the iZnO layer. The top TCO layer is typically between about 0.25 um and 1.0 um in thickness. The top TCO layer is typically formed using a (reactive) PVD (sputtering) technique or CVD technique. Optionally, the transparent top electrode can be printed or wet-coated from (silver) nano-wires, carbon nanotubes, and the like.

Figure 4:
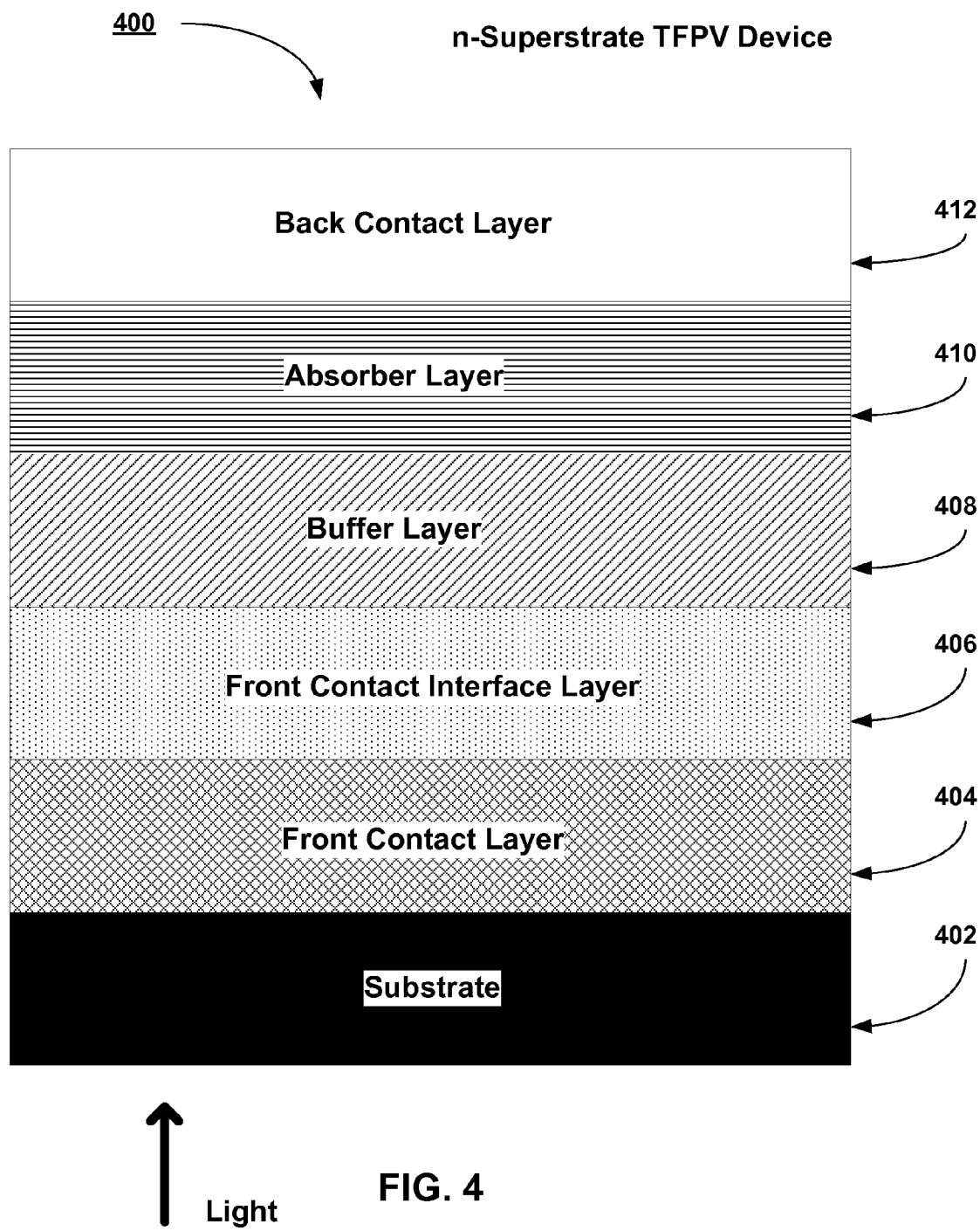
FIG. 4 illustrates a schematic diagram of a simple superstrate TFPV stack according to an embodiment described herein.

FIG. 4 illustrates a simple CIGS TFPV device material stack, 400, consistent with some embodiments of the present invention. The CIGS TFPV device illustrated in FIG. 4 is shown in a superstrate configuration wherein the glass substrate faces the incident sunlight. The convention will be used wherein light is assumed to be incident upon the substrate and material stack as illustrated. As used herein, this configuration will be labeled an "n-superstrate" configuration to denote that the n-type layer (i.e. buffer layer) is closest to the incident light. This label is to distinguish the configuration from an alternate configuration described with respect to FIG. 5 below. The formation of the CIGS TFPV device will be described starting with the substrate. Examples of suitable substrates comprise float glass, low-iron glass, borosilicate glass, flexible glass, specialty glass for high temperature processing, polyimide, plastics, etc. Furthermore, the substrates may be processed in many configurations such as single substrate processing, multiple substrate batch processing, in-line continuous processing, roll-to-roll processing, etc.

A low resistivity bottom TCO front contact layer, 404, (examples include Al:ZnO (AZO), (In,Sn)O (ITO), (In,Zn)O, B:ZnO, Ga:ZnO, F:ZnO, $F:SnO_2$, etc.) is formed on top of the substrate, 402. As used herein, the phrase "front contact" will be understood to be the primary current conductor layer situated between the substrate and the buffer layer in a superstrate configuration TFPV device. The bottom TCO layer is typically between about 0.3 um and 2.0 um in thickness. The bottom TCO layer is typically formed using a reactive PVD (sputtering) technique or CVD technique.

Optionally, a diffusion barrier and/or adhesion-promotion layer (not shown) may be formed between the substrate, 402, and the front contact layer, 404. When implemented, the diffusion barrier layer stops the diffusion of impurities from the substrate into the TCO, or alternatively, stops the diffusion and reaction of the TCO material and above layers with the substrate. Examples of common diffusion barrier and/or adhesion-promotion layers comprise chromium, vanadium, tungsten, nitrides such as tantalum nitride, tungsten nitride, titanium nitride, silicon nitride, zirconium nitride, hafnium nitride, oxy-nitrides such as tantalum oxy-nitride, tungsten oxy-nitride, titanium oxy-nitride, silicon oxy-nitride, zirconium oxy-nitride, hafnium oxy-nitride, oxides such as aluminum oxide, silicon oxide, carbides such as silicon carbide, binary and/or multinary compounds of tungsten, titanium, molybdenum, chromium, vanadium, tantalum, hafnium, zirconium, and/or niobium with/without the inclusion of nitrogen and/or oxygen. It should be understood that the diffusion barrier layer composition and thickness are optimized for optical transparency as necessary for the superstrate configuration. The diffusion barrier layer may be formed from any well known technique such as sputtering, ALD, CVD, evaporation, wet methods such as printing or spraying of inks, screen printing, inkjet printing, slot die coating, gravure printing, wet chemical depositions, or from sol-gel methods, such as the coating, drying, and firing of polysilazanes.

An intrinsic iZnO layer, 406, is then formed on top of the TCO layer. The iZnO layer is a high resistivity material and forms part of the transparent conductive oxide (TCO) stack that serves as part of the front contact structure. Other resistive metal oxides like $SnO_2$, resistive ZnO:Al, resistive In—Ga—Zn—O, etc. might be used instead of i-ZnO. The iZnO layer makes the TFPV device less sensitive to lateral non-uniformities caused by differences in composition or defect concentration in the absorber and/or buffer layers. The iZnO layer is typically between about 0 nm and 150 nm in thickness. The iZnO layer is typically formed using a reactive PVD (sputtering) technique or CVD technique.

An n-type buffer layer, 408, is then deposited on top of the iZnO layer, 406. Examples of suitable n-type buffer layers comprise CdS, ZnS, $In_2S_3$, $In_2(S,Se)_3$, (Cd,Zn)S, ZnO, Zn(O, S), (Zn,Mg)O, etc. CdS is the material most often used as the n-type buffer layer in CIGS TFPV devices. The buffer layer may be deposited using chemical bath deposition (CBD), chemical surface deposition (CSD), PVD (sputtering), printing, plating, ALD, Ion-Layer-Gas-Reaction (ILGAR), ultrasonic spraying, or evaporation. The thickness of the buffer layer is typically between about 30 nm and about 100 nm. The performance of the buffer layer is sensitive to materials properties such as crystallinity, grain size, surface roughness, composition, defect concentration, etc. as well as processing parameters such as temperature, deposition rate, thermal treatments, etc.

A p-type absorber layer, 410, of CIGS is then deposited on top of the buffer layer. The absorber layer may be formed, partially or completely, using a variety of techniques such as PVD (sputtering), co-evaporation, in-line evaporation, plating, printing or spraying of inks, screen printing, inkjet printing, slot die coating, gravure printing, wet chemical depositions, CVD, etc. Advantageously, the absorber layer is deficient in Cu. The Cu deficiency may be controlled by managing the deposition conditions. Advantageously, a small amount of Na is present during the growth of the absorber. The Na may be purposely added in the form of $Na_2Se$ or another Na source, prior, during, or after the deposition and/or growth of the absorber layer. Optionally, the absorber layer is deposited as a precursor layer that undergoes a selenization process after formation to convert the precursor to CIGS into a high-quality CIGS semiconductor film. The selenization process involves the exposure of the precursor and/or absorber layer to $H_2Se$, $H_2S$, Se vapor, S vapor, or diethylselenide (DESe) at temperatures most typically between about 300° C. and 700° C. It should be noted that the precursor to CIGS might already contain a chalcogen source (e.g. Se), either as a separate layer, or incorporated into the bulk of the precursor layer. The precursor film can be a stack of layers, or one layer. The precursor layer can be dense, or porous. The precursor film typically contains Cu, In, and Ga. The precursor layer is most commonly deposited by sputtering from e.g. binary Cu—Ga and In sputter targets. Nevertheless, plating and printing to deposit the metal precursor film containing Cu, In, and/or Ga are used as well. During subsequent processing, a layer of $Mo(S,Se)_2$ (not shown) is formed at the back contact/absorber layer interface and forms a fairly good ohmic contact between the two layers. The thickness of the absorber layer is typically between about 1.0 um and about 3.0 um. The performance of the absorber layer is sensitive to materials properties such as crystallinity, grain size, surface roughness, composition, defect concentration, etc. as well as processing parameters such as temperature, deposition rate, thermal treatments, etc.

A back contact layer, 412, is formed on absorber layer, 410. An example of a common back contact layer material is Mo for CIGS TFPV devices. The back contact layer may be formed by any number of deposition technologies. Examples of suitable deposition technologies comprise PVD (sputtering), evaporation, chemical vapor deposition (CVD), atomic layer deposition (ALD), plating, etc. The thickness of the back contact layer is typically between about 0.3 um and about 1.0 um. The back contact layer has a number of requirements such as high conductivity, good ohmic contact to the absorber layer, ease of bonding to tabs for external connectivity, ease of scribing or other removal, good thermo-mechanical stability, and chemical resistance during subsequent processing, among others. Other types of TFPV devices use different materials for the back contact. As an example, Cu-based materials such as Cu/Au, Cu/graphite, Cu/Mo, Cu:ZnTe/Mo, etc. are typically used for CdTe TFPV devices and TCO materials such as ZnO, ITO, $SnO_2$:F, etc. are typically used for a-Si TFPV devices.

Figure 5:
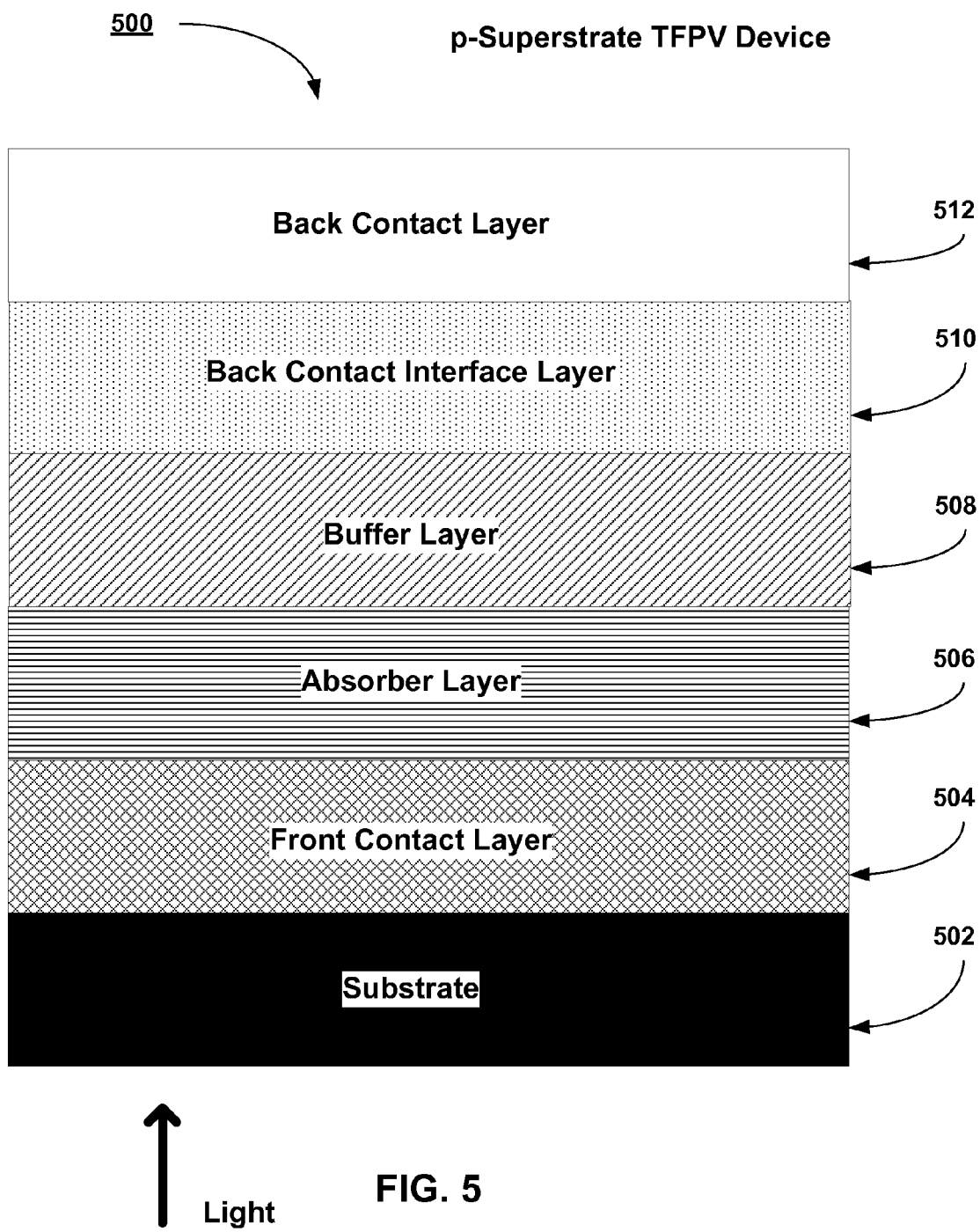
FIG. 5 illustrates a schematic diagram of a simple superstrate TFPV stack according to an embodiment described herein.

FIG. 5 illustrates a simple CIGS TFPV device material stack, 500, consistent with some embodiments of the present invention. The CIGS TFPV device illustrated in FIG. 5 is shown in a superstrate configuration wherein the glass substrate faces the incident sunlight. The convention will be used wherein light is assumed to be incident upon the substrate and material stack as illustrated. As used herein, this configuration will be labeled a "p-superstrate" configuration to denote that the p-type layer (i.e. absorber layer) is closest to the incident light. This label is to distinguish the configuration from the alternate configuration described with respect to FIG. 4 previously. The formation of the CIGS TFPV device will be described starting with the substrate. Examples of suitable substrates comprise float glass, low-iron glass, borosilicate glass, flexible glass, specialty glass for high temperature processing, polyimide, plastics, etc. Furthermore, the substrates may be processed in many configurations such as single substrate processing, multiple substrate batch processing, in-line continuous processing, roll-to-roll processing, etc.

A low resistivity bottom TCO front contact layer (examples include Al:ZnO (AZO), (In,Sn)O (ITO), (In,Zn)O, B:ZnO, Ga:ZnO, F:ZnO, F:$SnO_2$, etc.), 504, is formed on top of the substrate, 502. As used herein, the phrase "front contact" will be understood to be the primary current conductor layer situated between the substrate and the absorber layer in a superstrate configuration TFPV device. The bottom TCO layer is typically between about 0.3 um and 2.0 um in thickness. The bottom TCO layer is typically formed using a reactive PVD (sputtering) technique or CVD technique. The TCO can be a p-type TCO, (e.g. ternary-based oxide in the family of $Co_3O_4$-based spinels, like $Co_2ZnO_4$ and $Co_2NiO_4$). Nevertheless, it should be understood that an n-type TCO with an additional layer (e.g. a heavily-doped p-type semiconductor layer, or $MoSe_2$) between the TCO and the absorber can be used as well. Furthermore, the TCO might be a bi- or multi-layer of an n-type TCO in contact with the substrate, followed by an ultrathin metal layer, (e.g. like Ag), followed by a thin p-type TCO in contact with the absorber layer, with/without an additional $MoSe_2$ layer between the p-type TCO and the absorber layer.

Optionally, a diffusion barrier and/or adhesion-promotion layer (not shown) may be formed between the substrate, 502, and the front contact layer. 504. When implemented, the diffusion barrier and/or adhesion-promotion layer stops the diffusion of impurities from the substrate into the TCO, or alternatively, stops the diffusion and reaction of the TCO material and above layers with the substrate. Examples of common diffusion barrier and/or adhesion-promotion layers comprise chromium, vanadium, tungsten, nitrides such as tantalum nitride, tungsten nitride, titanium nitride, silicon nitride, zirconium nitride, hafnium nitride, oxy-nitrides such as tantalum oxy-nitride, tungsten oxy-nitride, titanium oxy-nitride, silicon oxy-nitride, zirconium oxy-nitride, hafnium oxy-nitride, oxides such as aluminum oxide, silicon oxide, carbides such as silicon carbide, binary and/or multinary compounds of tungsten, titanium, molybdenum, chromium, vanadium, tantalum, hafnium, zirconium, and/or niobium with/without the inclusion of nitrogen and/or oxygen. It should be understood that the diffusion barrier and/or adhesion-promotion layer composition and thickness are optimized for optical transparency as necessary for the superstrate configuration. The diffusion barrier and/or adhesion-promotion layer may be formed from any well known technique such as sputtering, ALD, CVD, evaporation, wet methods such as printing or spraying of inks, screen printing, inkjet printing, slot die coating, gravure printing, wet chemical depositions, or from sol-gel methods such as the coating, drying, and firing of polysilazanes.

A p-type absorber layer, 506, of CIGS is then deposited on top of the front contact layer. The absorber layer may be formed, partially, or completely, using a variety of techniques such as PVD (sputtering), co-evaporation, in-line evaporation, plating, printing or spraying of inks, screen printing, inkjet printing, slot die coating, gravure printing, wet chemical depositions, CVD, etc. Advantageously, the absorber layer is deficient in Cu. The Cu deficiency may be controlled by managing the deposition conditions. Advantageously, a small amount of Na is present during the growth of the absorber. The Na may be purposely added in the form of $Na_2Se$ or another Na source, prior, during, or after the deposition of the precursor and/or absorber layer. Typically, the absorber layer is deposited as a precursor layer that undergoes a chalcogenization (e.g. selenization) process after formation to convert the precursor to CIGS into a high-quality CIGS semiconductor film. The chalcogenization process involves the exposure of the precursor and/or absorber layer to $H_2Se$, $H_2S$, Se vapor, S vapor, or diethylselenide (DESe) at temperatures most typically between about 300° C. and 700° C. It should be noted that the precursor to CIGS might already contain a chalcogen source (e.g. Se), either as a separate layer, or incorporated into the bulk of the precursor layer. The precursor film can be a stack of layers, or one layer. The precursor layer can be dense, or porous. The precursor film typically contains Cu, In, and Ga. The precursor layer is most commonly deposited by sputtering from e.g. binary copper-gallium and Indium sputter targets. Nevertheless, plating and printing to deposit the metal precursor film containing Cu, In, and/or Ga are used as well. The thickness of the absorber layer is typically between about 1.0 µm and about 3.0 µm. The performance of the absorber layer is sensitive to materials properties such as crystallinity, grain size, surface roughness, composition, defect concentration, etc. as well as processing parameters such as temperature, deposition rate, thermal treatments, etc.

An n-type buffer layer, 508, is then deposited on top of the absorber layer. Examples of suitable n-type buffer layers comprise CdS, ZnS, $In_2S_3$, $In_2(S,Se)_3$, (Cd,Zn)S, ZnO, Zn(O, S), (Zn,Mg)O, etc. CdS is the material most often used as the n-type buffer layer in CIGS TFPV devices. The buffer layer may be deposited using chemical bath deposition (CBD), chemical surface deposition (CSD), PVD (sputtering), printing, plating, ALD, Ion-Layer-Gas-Reaction (ILGAR), ultrasonic spraying, or evaporation. The thickness of the buffer layer is typically between about 30 nm and about 100 nm. The performance of the buffer layer is sensitive to materials properties such as crystallinity, grain size, surface roughness, composition, defect concentration, etc. as well as processing parameters such as temperature, deposition rate, thermal treatments, etc.

An intrinsic iZnO layer, 510, is then formed on top of the buffer layer. The iZnO layer is a high resistivity material and forms part of the back contact structure. Other resistive metal oxides like $SnO_2$, resistive ZnO:Al, resistive In—Ga—Zn—O, etc. might be used instead of i-ZnO. The iZnO layer makes the TFPV device less sensitive to lateral non-uniformities caused by differences in composition or defect concentration in the absorber and/or buffer layers. The iZnO layer is typically between about 0 nm and 150 nm in thickness. The iZnO layer is typically formed using a reactive PVD (sputtering) technique or CVD technique.

A back contact layer, 512, is formed on intrinsic iZnO layer, 510. An example of a suitable back contact layer material is a thin n-type TCO followed by Ni and/or Al. The back contact layer may be formed by any number of deposition technologies. Examples of suitable deposition technologies comprise PVD (sputtering), evaporation, chemical vapor deposition (CVD), atomic layer deposition (ALD), plating, etc. The thickness of the back contact layer is typically between about 0.3 µm and about 1.0 µm. The back contact layer has a number of requirements such as high conductivity, good ohmic contact to the absorber layer, ease of bonding to tabs for external connectivity, ease of scribing or other removal, good thermo-mechanical stability, and chemical resistance during subsequent processing, among others. Other types of TFPV devices use different materials for the back contact. As an example, Cu-based materials such as Cu/Au, Cu/graphite, Cu/Mo, Cu:ZnTe/Mo, etc. are typically used for CdTe TFPV devices and TCO materials such as ZnO, ITO, $SnO_2$:F, etc. are typically used for a-Si TFPV devices.

The film stack described above is just one example of a film stack that can be used for TFPV devices. As an example, another substrate film stack (i.e. similar configuration as FIG. 3) might be: substrate/AZO/Mo/$MoSe_2$/CIGS/CdS/iZnO/AZO with AZO being ZnO:Al. As an example, another p-superstrate film stack (i.e. similar configuration as FIG. 5) might be: substrate/barrier/ZnO:Al/Mo/$MoSe_2$/CIGS/CdS/iZnO/ZnO:Al/Al. The detailed film stack configuration is not meant to be limiting, but simply serves as an example of the implementation of embodiments of the present invention.

Figure 6:
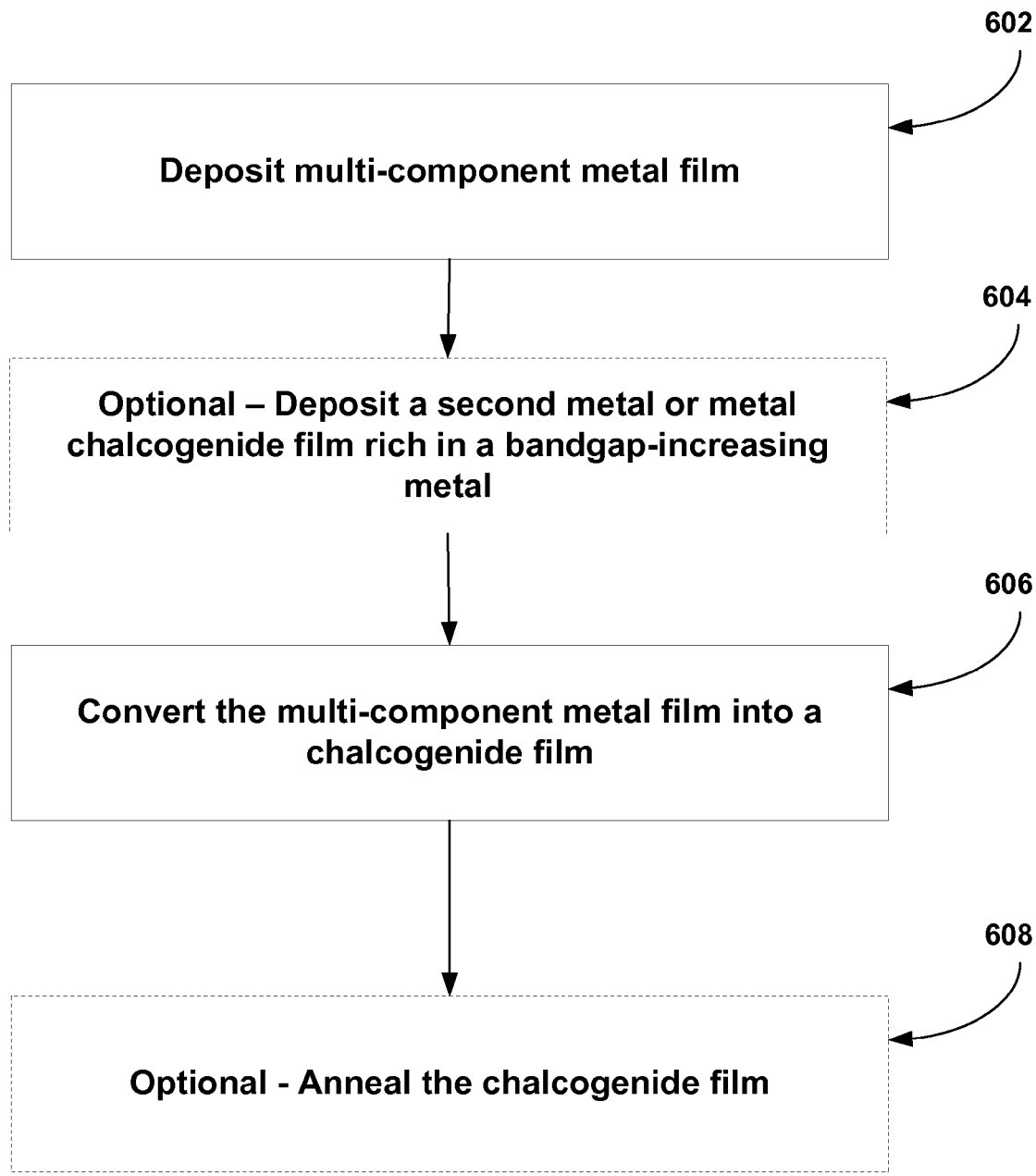
FIG. 6 is a flow chart for a generic 2-step process to form a CIGSe absorber layer.

The formation of the absorber layer is typically a multi-step process. One way of grading CIGS materials is by a 2-step approach as illustrated in FIG. 6. In step 602, "metal precursor" films are deposited. For CIGS-like absorbers, the metal precursor films comprise Group IB and Group-IIIA metals. In the case of CIGS absorbers, the metal precursor films comprise Cu, In, and Ga, with/without a Na source. This metal film needs to be converted to one or more chalcogenide compound(s) to form the absorber layer. The metal precursor film is converted to one or more chalcogenide compound(s) by heating the film in the presence of a source of one or more Group-VIA elements as indicated in step 606. Optionally, the chalcogenide film can be annealed as indicated in step 608.

For CIGS-type absorbers, a variation of the 2-step process comprises depositing a second thin Group-IIIA-containing film or Group-IIIA chalcogenide material (e.g. Ga—Se, or Al—Se) on top of the metal precursor film as illustrated in step 604. The Group-IIIA metal is bound in the chalcogenide, its diffusion (e.g. Ga, or Al) toward the back of the absorber layer is retarded, yielding a higher concentration of the Group-IIIA metal at the front of the absorber layer. This results in a double-graded composition of the Group-IIIA metal and a double-graded bandgap.

Generally, the 2-step method may comprise more than two steps when various wet chemical and/or conversion methods and/or wet or dry surface treatments (e.g. for densification or contaminant removal) and/or deposition steps (e.g. for a separate chalcogen layer as discussed previously) are used to form the metal precursor film. As discussed above, the metal precursor film may be a single layer or may be formed from multiple layers, it may be dense or porous.

The highest efficiencies for 2-step CIG(S)Se have been achieved by converting PVD (sputtered) Cu(In,Ga) into CIG(S)Se by a chalcogenization process where the Cu(In,Ga) film is both selenized and sulfurized, meaning the final absorber (CIGSSe) contains both selenium and sulfur. Unfortunately, CIG(S)Se formed using a 2-step process has not yet achieved >20% efficiency, and lags behind the laboratory champion of CIGSe. This is mainly due to the fact that it is challenging to control both bandgap grading and maintain a high minority carrier lifetime when sulfur is introduced.

Unfortunately, the traditional 2-step approach based on Cu(In,Ga) followed by selenization (without introducing sulfur) has so far only resulted in flat bandgap profiles, or single-graded CIGSe, resulting in efficiencies<16.0%.

It should be noted that the above cited efficiencies are laboratory champion efficiencies for ~0.5 $cm^2$ solar cells, not to be confused with commercially available, average, solar panel efficiencies which are typically 5-6% lower than laboratory champions, due to a combination of non-uniformity within solar cells, mismatch between series-connected cells, absorption losses in thick TCO layers, encapsulant, and glass, scribe and edge losses, and additional series resistance, all in addition to running a different process in the factory compared to the laboratory.

One of the main challenges for 2-step selenization is to control the phase separation in the Cu-poor film. High efficiency CIG(S)Se requires a Cu-poor (p-type) CIGSe film. Cu-poor Cu(In,Ga) metal films prior to chalcogenization are multi-phasic (2 or more separate phases present in the film), and as such, are hard to deposit in a homogeneous fashion that provides a conformal, smooth, uniform Cu(In,Ga) film, especially, due to the fact that indium-rich phases have the tendency to agglomerate due to poor wetting of underlying surfaces. Laterally uniform Cu(In,Ga) and Cu(In,Ga)$Se_2$ films are needed to avoid the formation of weak diodes that reduce the overall solar cell efficiency.

The agglomeration of indium is typically minimized by reducing the dynamic deposition rate, and/or controlling the substrate temperature during PVD, and/or introducing a multi-layer stack of alternating layers of In-rich and Cu-rich layers, all resulting in additional Capital Expenditure (CapEx). Other approaches try to avoid the phase separation by depositing a chalcogenide precursor film by PVD from binary, or multinary chalcogenide targets which results in a CapEx investment typically >3× higher than for PVD-CIG due to the deposition of a film ~3× thicker with a lower dynamic deposition rate. In addition, direct material costs for the chalcogenide targets are higher than for the metallic targets.

A second challenge for 2-step selenization is to control bandgap grading in depth in the final CIGSe film by Ga/(In+Ga) compositional grading. Ga-rich phases selenize slower than Cu and In, and therefore, most of the Ga collects at the back of the CIGSe film resulting in a single-graded CIGSe film. One way to avoid this Ga migration and maintain a flat Ga distribution is to extend the selenization time (>30 min), and go to high temperatures (550-600 C), not compatible with all low-temperature, low-cost substrates. Furthermore, this has not resulted in any double-graded CIGSe (>20%).

A third challenge for 2-step selenization is to prevent adhesion failure of the CIGSe film due to stress resulting from the expansion from Cu(In,Ga) to CIGSe at elevated temperature. The expansion from the metal film to the chalcogenide film can be 2.5-3.0× in volume. Additionally, the overall stack of layers may have very different coefficients of thermal expansion, thickness, and Young's modulus.

Figure 7:
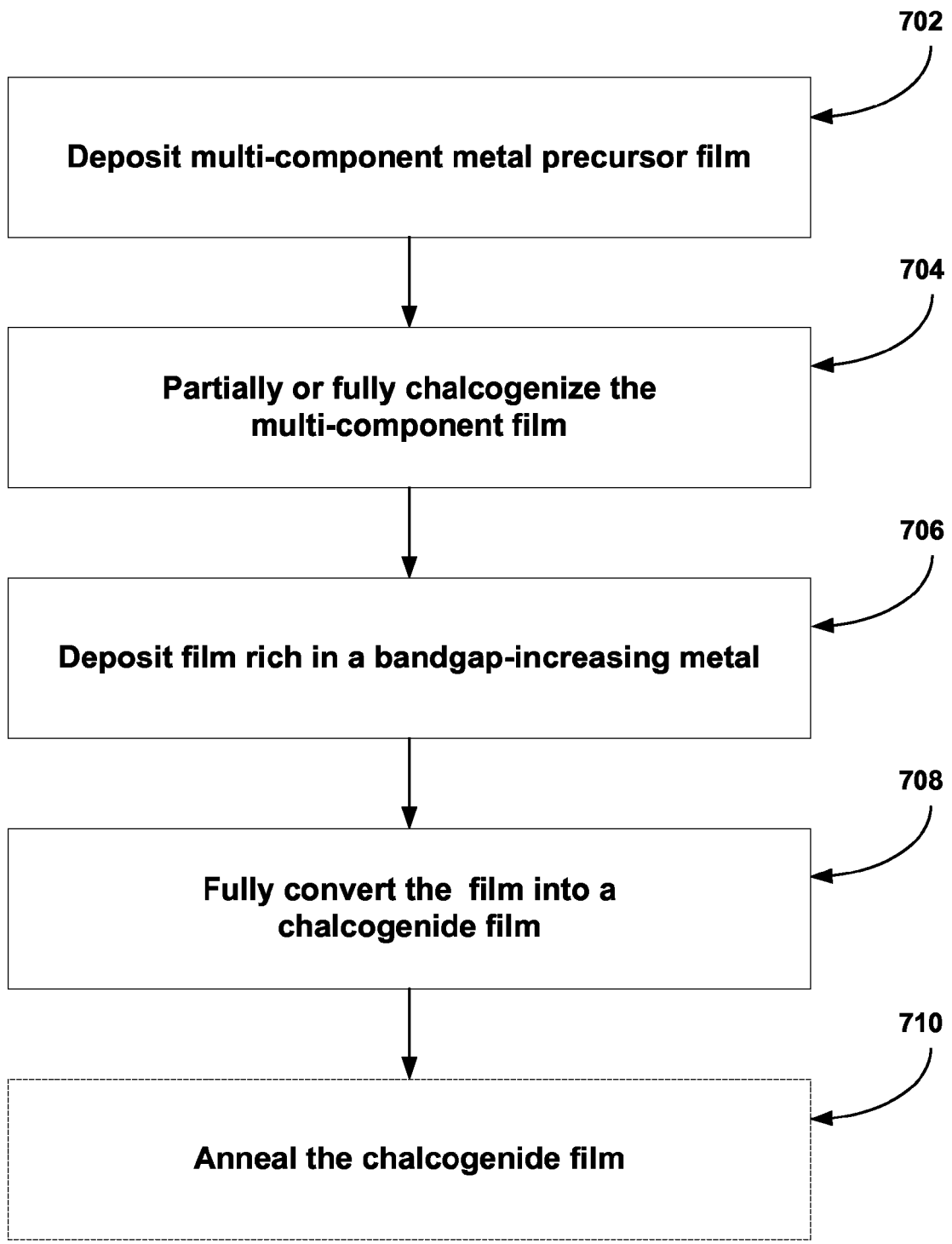
FIG. 7 is a flow chart for a generic 4-step process to form a CIGSe absorber layer.

A second way of grading CIGS materials is by a 4-step approach as illustrated in FIG. 7. In step 702, "metal precursor" films are deposited. For CIGS-like absorbers, the metal precursor films comprise Group IB and Group-IIIA metals. In the case of CIGS absorbers, the metals comprise Cu, In, and Ga, with/without a Na source. This metal precursor film needs to be converted to a chalcogenide to form the absorber layer. The metal precursor film is converted (partially or fully) to a chalcogenide by heating the film in the presence of a source of one or more Group-VIA elements as indicated in step 704. As used herein, it will be understood that "partially converted" will be understood to mean that at least a portion of the metal precursor film is converted to a chalcogenide through exposure to a chalcogen at elevated temperature. In step 706, a layer rich in a bandgap-increasing metal (relative to the metal precursor film deposited in step 702) is formed on the surface of the partially or fully chalcogenized precursor film. For example, if the metal precursor film deposited in step 702 is a Cu—In—Ga material, then at least one of Ga/(Ga+In) or Ag/(Ag+Cu) is greater in the layer deposited in step 706 than in the metal precursor film deposited in step 702. In step 706, the layer rich in a bandgap-increasing metal may be a metal, a metal alloy, or a metal chalcogenide material (e.g. metal oxide, metal sulfide, metal selenide, metal telluride, etc.). In step 708, the entire precursor stack to form the final absorber is converted using a chalcogenization process. The chalcogenization process may include an additional anneal step at the end to improve the device performance as illustrated in step 710. Details of a chalcogenization process including an additional anneal step are described in U.S. patent application Ser. No. 13/283,225, entitled "Method of Fabricating CIGS by Selenization at High Temperatures", filed on Oct. 27, 2011, which is herein incorporated by reference.

Generally, the 4-step method may comprise more than 4 steps when various wet chemical and/or conversion methods and/or wet or dry surface treatments (e.g. for densification or contaminant removal) and/or deposition steps are used to form the metal precursor film and/or the metal rich layer. As discussed above, the metal precursor film and/or the metal rich layer may each be a single layer or may each be formed from multiple layers, it may be dense or porous.

In each of the multi-step methods described herein, the performance of the absorber layer can be improved by incorporating a small amount (i.e. about 0.1 atomic %) of Na prior, during, or after the growth of the absorber layer. The incorporation of Na results in improved film morphology, higher conductivity, and beneficial changes in the defect distribution within the absorber material. The Na may be introduced in a number of ways. The Na may diffuse out of the glass substrate, out of a layer disposed between the glass substrate and the back contact (e.g. a Na containing sol-gel layer formed under the back contact), or out of the back contact (e.g. molybdenum doped with a Na salt). The Na may be introduced from a separate Na containing layer formed on top of the back contact. The Na may be introduced by incorporating a Na source in the Cu(In, Ga) precursor film. Examples of suitable Na sources comprise $Na_2Se$, $Na_2O_2$, NaF, $Na_2S$, etc. The Na may be introduced from a separate Na containing layer formed on top of the Cu(In, Ga) precursor film. The Na may be introduced from a separate Na containing layer formed on top of the partially or completely chalcogenized CIGS film. The Na may be introduced by incorporating a Na source in the Ga-rich film. The Na may be introduced from a separate Na containing layer formed on top of the Ga-rich film. The Na may be introduced by incorporating a Na source during the selenization step. The Na may be introduced after the final selenization step, followed by a heat treatment. The Na may be introduced by combining any of these methods as required to improve the performance of the absorber layer. It should be noted that similar Group IA, and/or Group IIA elements like K, and Ca might be used instead of sodium.

In each of the multi-step methods described above and the examples to be disclosed below, a metal precursor film(s) is deposited. Typically, the precursor material will deviate in shape, size, composition, homogeneity, crystallinity, or some combination of these parameters from the absorber material that is ultimately formed as a result of the method. As mentioned previously, the metal precursor film(s) can comprise multiple layers. These layers may be deposited by the same or by different deposition techniques. These layers can be porous, or dense.

The metal precursor film(s) can be deposited using a number of techniques. Examples comprise dry deposition techniques such as batch or in-line (co)evaporation, batch or in-line PVD (sputtering), ALD, CVD, Plasma enhanced CVD (PECVD), Plasma enhanced ALD (PEALD), atmospheric pressure CVD (APCVD), ultra-fast atmospheric ALD, etc.

The efficiency of a TFPV device depends on the bandgap of the absorber material. The goal is to have the bandgap tuned to the energy range of the photons incident on the device. The theoretical upper limit for a single p-n junction solar cell has been calculated to be about 33 to 34%. The peak in the efficiency occurs for values of the bandgap between about 1.0 eV and about 1.5 eV, and more specifically between about 1.3 eV and about 1.5 eV. The bandgap for CIGSe films varies smoothly from CISe=1.00 (i.e. Ga/(Ga+In)=0.0) to CGSe=1.68 (i.e. Ga/(Ga+In)=1.0). The region of interest is from Ga/(Ga+In)=0.4 (~1.23 eV) to Ga/(Ga+In)=0.7 (~1.45 eV).

In high volume manufacturing, the Cu—In—Ga precursor film is typically deposited using a PVD (sputtering) process. The deposition system may be a batch system or an in-line system, but the in-line system is preferred due to higher throughput and lower cost of ownership. The in-line system may be continuous (i.e. the substrates move continuously through the system) or the in-line system may use a "stop and soak" process wherein the substrates are transported to a process station where they stop until the process is completed. In-line systems typically include a number of process stations to allow different compositions to be deposited or to break a long deposition cycle into smaller, balanced, deposition cycles to increase the overall equipment efficiency of the system. At each process station, the substrate may be subjected to small translational oscillations to improve the uniformity of the deposition. This oscillation is not considered part of the transport of the substrate.

Figure 8:
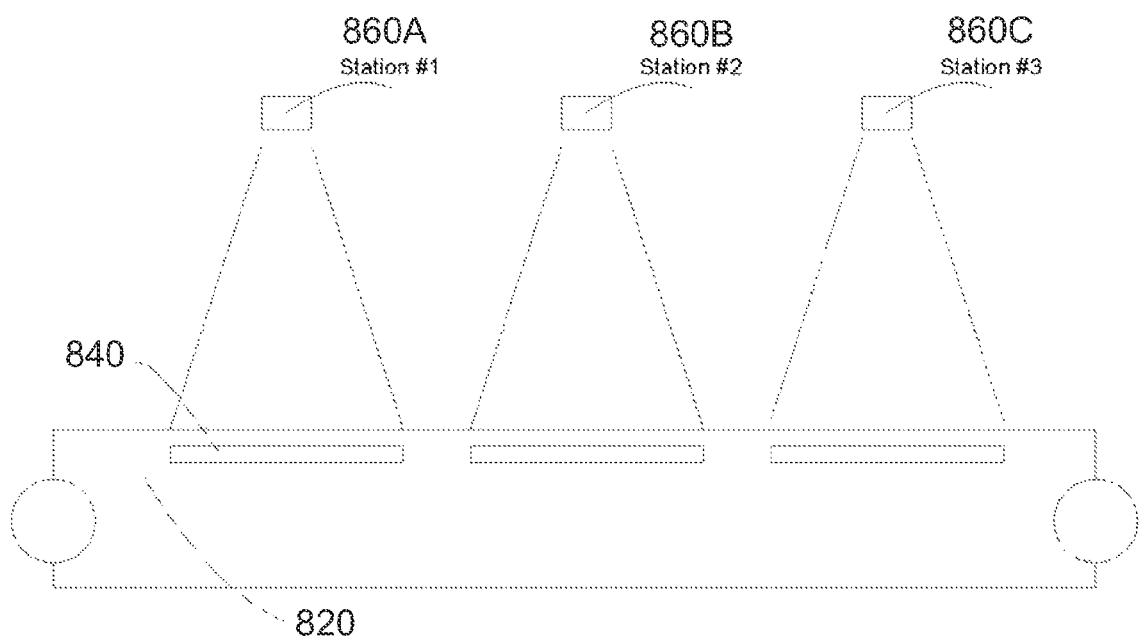
FIG. 8 is a schematic of an in-line deposition system according to some embodiments.

FIG. 8 illustrates an exemplary in-line deposition (e.g. sputtering) system according to some embodiments of the present invention. FIG. 8 illustrates a system with three deposition stations, but those skilled in the art will understand that any number of deposition stations can be supplied in the system. For example, the three deposition stations illustrated in FIG. 8 can be repeated and provide systems with 6, 9, 12, etc. targets, limited only by the desired layer deposition sequence and the throughput of the system. A transport mechanism 820, such as a conveyor belt or a plurality of rollers, can transfer substrate 840 between different deposition stations. For example, the substrate can be positioned at station #1, comprising a target assembly 860A, then transferred to station #2, comprising target assembly 860B, and then transferred to station #3, comprising target assembly 860C. Station #1 can be configured to deposit a Cu—In—Ga precursor film. Station #2 can be configured to deposit an additional Cu—In—Ga precursor film with the same or different composition. Station #3 can be configured to deposit an additional Cu—In—Ga precursor film with the same or different composition.

As noted in the Background section, high-efficiency absorbers are Cu-poor (Cu/(In+Ga)<1), and Ga-poor (Ga/(In+Ga)<0.4). However, Cu(In,Ga) metal films with these preferred atomic ratios are multi-phasic and tend to separate into discrete phases when deposited, especially when exposed to processing temperatures above about 155° C. Embodiments of the instant invention provide layer compositions existing as stable phases. The use of stable phases obviates some of the difficulties in absorber layer manufacture involving agglomeration of In and phase separation, e.g., excessive changes in grain size and crystallinity, resulting in a change in roughness of the film above 5-10 nm. In some embodiments, targets are used wherein the target material exists as a stable phase. When sputtered onto a substrate or other layers, this material exists in the same stable phase as its original composition.

Ag can be substituted for part of the Cu in CIGS absorbers. There are multiple reasons why such a substitution can be beneficial. Ag can increase the bandgap. The increase in bandgap can be useful in itself, and the difference in bandgap compared to Cu can be exploited to grade the bandgap across the thickness of the absorber. Such graded bandgap layers can provide improved conversion of photon energy to electron energy by reducing recombination. Ag can also lower the structural defects in the absorber due to the lower melting temperature of $AgInSe_2$ and $AgGaSe_2$ compared to $CuInSe_2$ and $CuGaSe_2$. For example, $AgInSe_2$ (MP=780° C.) has lower melting temperature compared to $CuInSe_2$ (MP=986° C.); while $AgGaSe_2$ (MP=850° C.) has lower melting temperature compared to $CuGaSe_2$ (MP=1094° C.)).

However, as discussed in the Background section above, sputtering from pure Ag targets can result in poor material utilization and low deposition rates. The deposition rate when using an elemental Ag target is diminished in comparison with deposition rates when using Ag-metal alloy targets. In addition, sputtered elemental Ag is known to agglomerate, resulting in phase inhomogeneity (roughness). Use of Ag—In alloys can provide improved deposition rates at higher conformality and precursor layer quality.

Figure 9:
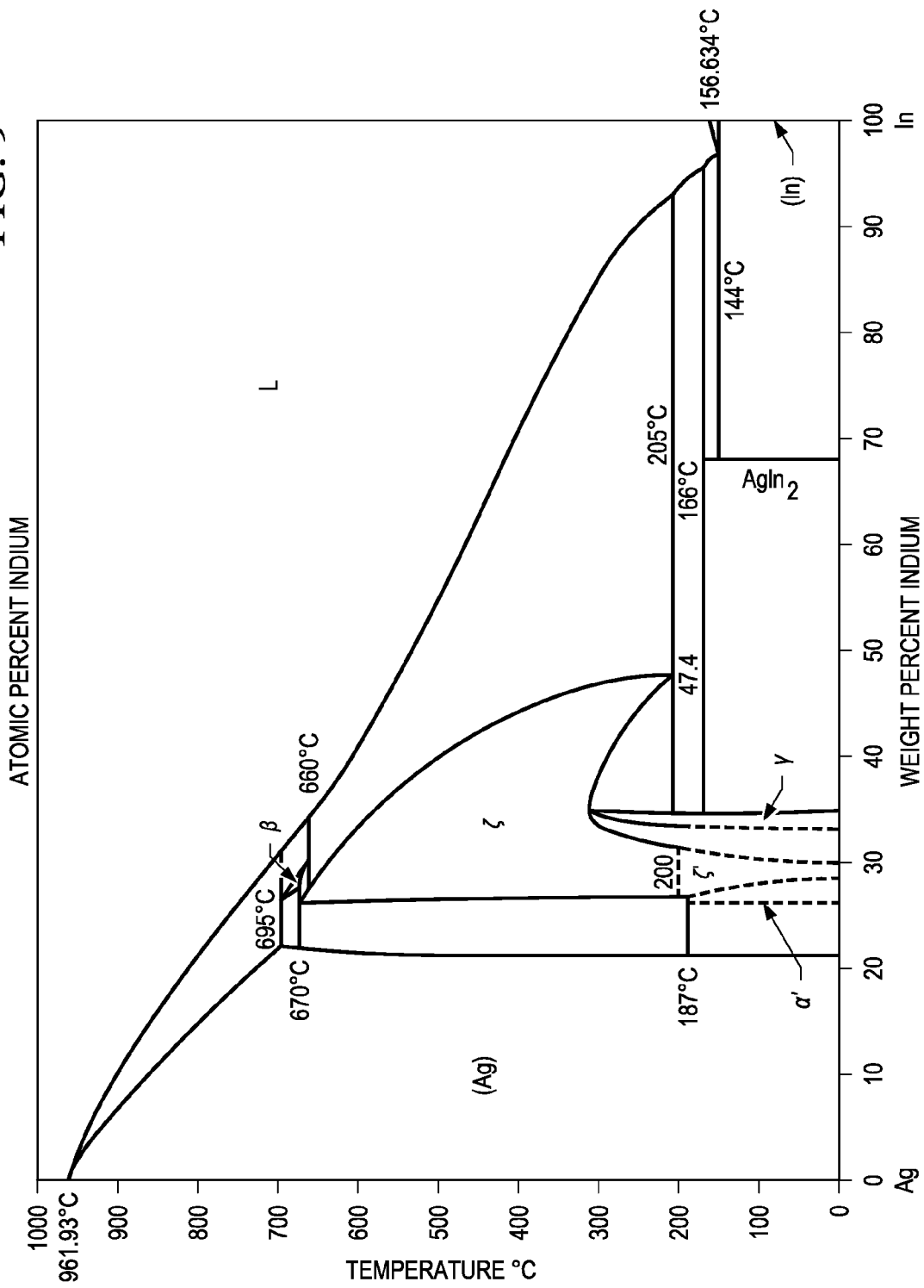
FIG. 9 is a binary phase diagram for In and Ag.

A phase diagram for Ag—In alloys is shown in FIG. 9 (reproduced from FIG. 1 of Lee et al., "High temperature silver-indium joints manufactured at low temperature" *Thin Solid Films*, 366, (1-2), 196-201, 2000, incorporated herein by reference). When a layer is formed from a target comprising less than 21% In in Ag, the layer is a single stable phase even when temperature is increased. The grain size and surface roughness likewise remain substantially stable, and diffusion between layers is minimized, depending on the phase behavior of the aggregate of the elements in the adjacent layers. It can be seen that Ag—In forms a solid solution containing up to 21 wt % In over a broad temperature range from 0 to 700° C. Homogeneous targets containing up to 21 wt % In in Ag can therefore be readily made by low-cost methods such as casting.

Similarly, a layer can be formed of a Ag—In composition of approximately 26-35 wt. % In, illustrated in the phase diagram shown in FIG. 9 (multiple regions). These compositions include the intermetallic compound $Ag_2In$, and exist over a broad temperature range up to at least 600° C. In addition, a layer can be formed of the intermetallic compound $AgIn_2$ (up to 68.1 wt. % In). Above 166° C., it is known that $AgIn_2$ decomposes into liquid In with $Ag_2In$ grains. In addition, a layer can be formed of the $Ag_3In$, which is stable up to 187° C.

In some embodiments, Ag—In targets are used to form one or more of the thermodynamically stable layers in the precursor film. As will be shown by example below, the number of targets required to make Ag-CIG layers can be reduced. The deposition rate of Ag using Ag—In alloy targets can be higher than for pure Ag targets. Both Ag and In tend to agglomerate if deposited separately; co-deposition tends to result in smoother alloy films leading to better homogeneity in the finished Ag-CIGS layer.

Grading can also be achieved by selective substitution of Ag for Cu and S for Se in a graded fashion. The addition of Ag can also lower structural defects in the absorber due to the lower melting temperature of $AgInSe_2$, $AgGaSe_2$, $AgInS_2$, $AgGaS_2$ compared to CISe, CGSe, CIS (sulfur), CGS (sulfur), CIGSe, and CIGSSe. In order to introduce Ag into the layer, Ag sputtering targets have been used, for example, in combination with sequential sputtering from In, Cu, and $Cu_x$-$Ga_y$ targets. However, the use of elemental Ag targets, like the use of In targets, can result in agglomerated and inhomogeneous deposition of sputtered material. In addition, the use of Ag targets to form absorber layers results in low deposition rates and poor material utilization rate for the relatively expensive Ag if target and tool design is not optimized.

In some embodiments, the phase separation can be avoided by depositing alternating layers of a Cu-rich and Ga-rich Cu—In—Ga layer from a Cu—In—Ga target and a pure In layer from an In target. Indium readily wets a CIG layer, and the CIG layer is thermodynamically stable for Cu/(In+Ga)>2 and Ga/(Ga+In)>0.5. A CIG layer with these atomic proportions does not exhibit agglomeration or segregation. Preferably, Ga/(Ga+In)>0.6. Most of the In is deposited in the pure In layer. The stability of the CIG layer with low In content is apparent in the ternary phase diagram shown in FIG. 10 (from FIG. 4 of Purwins et al., "Phase relations in the ternary Cu—Ga—In system," *Thin Solid Films* 515, 5895-98, 2007, incorporated herein by reference).

In some embodiments, elemental metal targets consisting essentially of In or Cu can be used to form precursor layers comprising elemental metals or alloys. The stability of the stack of layers is dictated by the phase diagram of the elements involved, not the stability of one layer by itself. For example, a stack of precursor layers having the composition $Cu_2(In_{0.25},Ga_{0.75})$ and In is thermodynamically stable up to several hundred degrees. Use of stable precursor layers results in minimal interdiffusion between layers and minimal morphological changes laterally.

Figure 10:
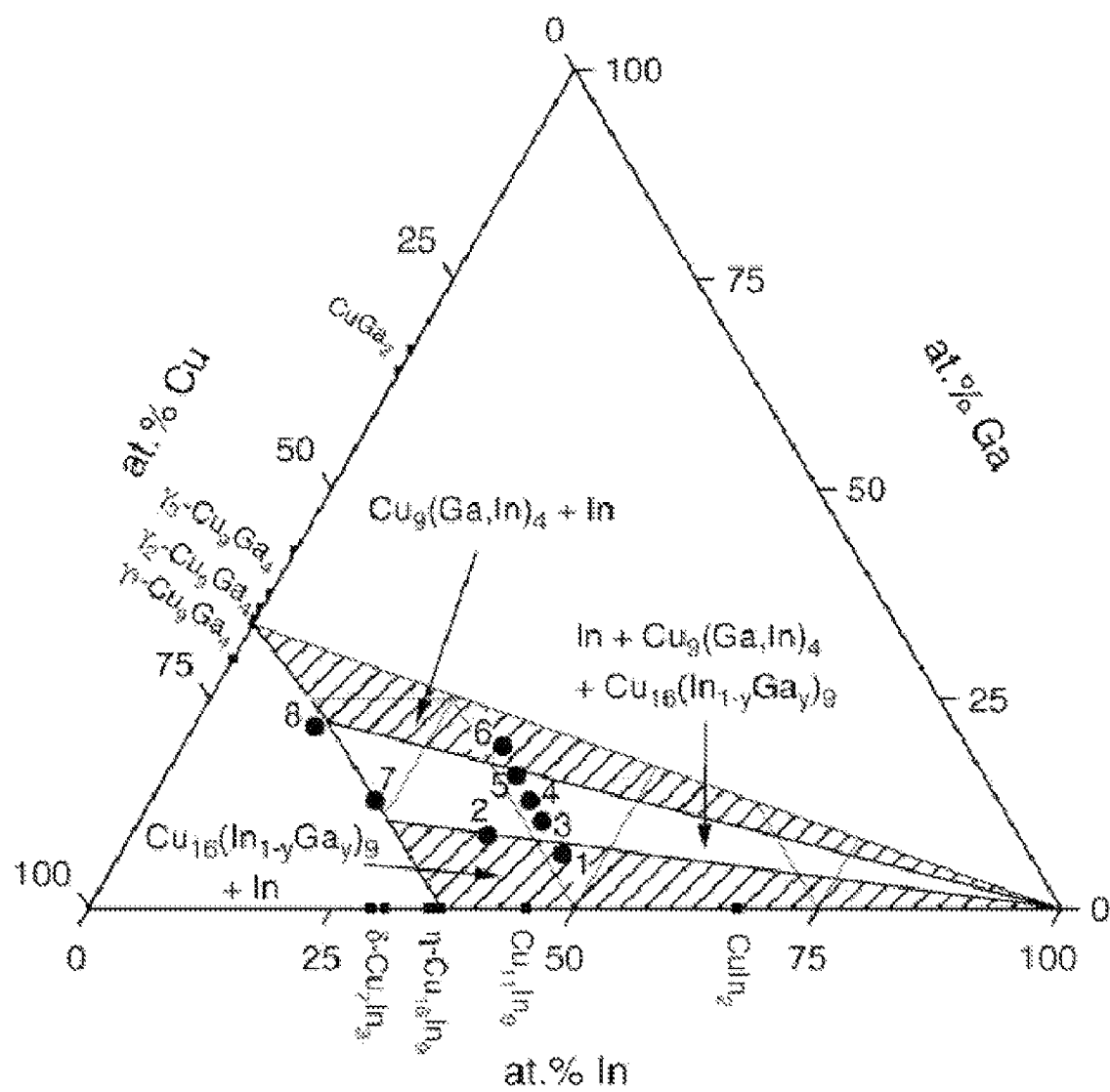
FIG. 10 is ternary phase diagram for In, Ga and Cu.

Cu—Ga targets can be used wherein the Cu and Ga composition is such that the material exists in a stable phase. A ternary phase diagram is shown in FIG. 10, illustrating the phases existing in ternary mixtures of Cu, Ga and In. Binary targets comprising Cu and Ga can include the following compositions: $CuGa_2$, $Cu_{16}Ga_{11}$, $Cu_{60}Ga_{40}$, $Cu_9Ga_5$, $Cu_{65}Ga_{35}$, $Cu_{68}Ga_{32}$, $Cu_9Ga_4$ $Cu_{75}Ga_{25}$, $Cu_{85}Ga_{15}$. Ternary target compositions can be used, including $Cu_9(Ga_{0.75}In_{0.25})_4$ $Cu_{11}(Ga_{0.35}In_{0.65})_4$ $Cu_{11}(Ga_{0.45}In_{0.55})_4$ $Cu_{11}(Ga_{0.55}In_{0.45})_4$ $Cu_{0.85}(Ga_{0.25}In_{0.75})$ $Cu_{0.85}(Ga_{0.35}In_{0.65})$ $Cu_{0.85}(Ga_{0.45}In_{0.55})$ $Cu_{0.83}(Ga_{0.3}In_{0.7})$.

As an exemplary composition, if x is the number of In atoms in the CIG layer, then the number of Ga atoms can be 1.5x (giving Ga/(Ga+In)=0.6). The number of Cu atoms in the CIG layer can be at least 5x (giving Cu/(Ga+In)>2). The In layer can contain 3x In atoms. The resulting layer pairs contain the desired Cu-poor and Ga-poor compositions: (Cu/(In+Ga) >0.9; Ga/(In+Ga)=0.27. Subsequent selenization and/or sulfurization of the CIG film can be performed without risk of phase separation in an early stage of the heating process. In terms of atomic percentages, the exemplary CIG target and layer comprise at least 67 atomic percent Cu, with 20 atomic percent gallium and 13 atomic percent indium (the Ga and In being reduced proportionally as the Cu is increased). The total thickness of deposited In layers is adjusted to contain three times the amount of In in the CIG layer. Other similar compositions can be made that meet the thermodynamic stability limitations for the CIG target with the In layer thickness adjusted to achieve the desired net CIG composition ratios in the finished absorber.

In some embodiments, phase separation can be avoided by using a set of three targets: Cu—Ga, Cu, and $In_2Se_3$ (and/or $In_2S_3$). These targets can be used sequentially to deposit layers which are individually stable to above 400° C. and can be deposited conformally with little or no agglomeration. Multiple sets of the three layers can be deposited to achieve a desired total thickness and to allow for grading of the composition across the total thickness. In some embodiments, the $In_2Se_3$ and/or $In_2S_3$ layers can be formed from an In metal target by reactive sputtering in an atmosphere comprising $H_2S$ and/or $H_2Se$ and/or Se and/or S. The amount of S or Se incorporated into the layer from these three targets is generally not sufficient to fully selenize/sulfurize the metals, and a further selenization/sulfurization step can be implemented in a batch or inline furnace to complete the formation of the desired absorber composition. Because the three precursor layers are individually stable, no agglomeration occurs during deposition and the initial stages of the conversion step. Ga migration can also be reduced compared to that which occurs when individual metal targets are used to deposit the metals, and the grading of Ga content across the finished CIGS layer can be better controlled.

Cu—Ga targets are used wherein the Cu—Ga target is formed using hot (isostatic pressure) techniques to form the targets from (atomized) powders. This technique allows a broad range of Ga concentrations to be realized. Additionally, other elements may be included within the target such as Ag and In, and optionally, a source of Na, or similar element like K, Mg, or Ca. The targets will be largely metallic and the sputtering yields of these components are similar in the typical processing ranges used to deposit Cu—In—Ga precursor films. Therefore, it is not a requirement that the targets be manufactured as single phase or with a composition that corresponds to an equilibrium compound.

In some embodiments, the Ga content is greater than about 25 atomic %. In some embodiments, the target includes a Cu concentration of about 60 atomic % and a Ga concentration of about 40 atomic % (i.e. $Cu_{60}Ga_{40}$). In some embodiments, the target includes a Cu concentration of about 33.3 atomic % and a Ga concentration of about 66.6 atomic % (i.e. $Cu_1Ga_2$). In some embodiments, the target includes a Cu—$In_y$—$Ga_x$ material wherein (x+y) is between about 25 atomic % and about 66 atomic %. In some embodiments, the target includes a $Cu_wAg_z$—$In_yGa_x$ material wherein (x+y) is between about 25 atomic % and about 66 atomic %. In some embodiments, the targets comprise Ag and In containing less than 21% In by weight. In some embodiments, the target comprises Cu and Ga comprising less than 45% Ga by weight. In some embodiments, the target comprises Cu(In,Ga), wherein the Cu(In,Ga) target has an atom ratio of Cu to (In+Ga) greater than 2 and an atom ratio of Ga to (Ga+In) greater than 0.5. In some embodiments, the target comprises $Cu_2(In_xGa_{1-x})$, x=0.25. In some embodiments, the target comprises elemental In and is used in a chalcogenizing atmosphere. In some embodiments, the target is $In_2Se_3$, $In_2S_3$, or $In_2(S,Se)_3$ or mixtures thereof.

Table 1 lists a number of potential target compositions that can be used to deposit precursor layers in accordance with embodiments of the invention. A wide variety of target compositions can be utilized so long as the precursor layers deposited exhibit thermodynamically stable phase behavior. A plurality of targets can be used for simultaneous deposition in order to form a desired composition in a particular precursor layer. Those skilled in the art will understand that the potential target compositions listed in Table 1 are exemplary and that other potential target compositions are possible. One of skill in the art will recognize that the listed targets do not necessarily match the composition of layers to be formed in some embodiments, and it may be necessary to use a combination of two or more targets from Table 1 to achieve the desired layer composition. The present invention is not limited to the specific examples listed in Table 1; any combination of targets can be used that enable the deposition of layers having the desired composition.

TABLE 1

Target compositions for Cu—In—Ga precursor layers

| Formula for composition | Cu | Ga | In | At. % Cu | At. % Ga | At. % In |
|---|---|---|---|---|---|---|
| In | 0.00 | 0.00 | 1.00 | 0.00 | 0.00 | 100.00 |
| $CuIn_2$ | 1.00 | 0.00 | 2.00 | 33.33 | 0.00 | 66.67 |

TABLE 1-continued

Target compositions for Cu—In—Ga precursor layers

| Formula for composition | Cu | Ga | In | At. % Cu | At. % Ga | At. % In |
|---|---|---|---|---|---|---|
| $Cu_{11}In_9$ | 11.00 | 0.00 | 9.00 | 55.00 | 0.00 | 45.00 |
| $Cu_9In_5$ | 9.00 | 0.00 | 5.00 | 64.29 | 0.00 | 35.71 |
| $Cu_9In_4$ | 9.00 | 0.00 | 4.00 | 69.23 | 0.00 | 30.77 |
| $CuGa_2$ | 1.00 | 2.00 | 0.00 | 33.33 | 66.67 | 0.00 |
| $Cu_{16}Ga_{11}$ | 16.00 | 11.00 | 0.00 | 59.26 | 40.74 | 0.00 |
| $Cu_{60}Ga_{40}$ | 60.00 | 40.00 | 0.00 | 60.00 | 40.00 | 0.00 |
| $Cu_9Ga_5$ | 9.00 | 5.00 | 0.00 | 64.29 | 35.71 | 0.00 |
| $Cu_{65}Ga_{35}$ | 65.00 | 35.00 | 0.00 | 65.00 | 35.00 | 0.00 |
| $Cu_{68}Ga_{32}$ | 68.00 | 32.00 | 0.00 | 68.00 | 32.00 | 0.00 |
| $Cu_9Ga_4$ | 9.00 | 4.00 | 0.00 | 69.23 | 30.77 | 0.00 |
| $Cu_{75}Ga_{25}$ | 75.00 | 25.00 | 0.00 | 75.00 | 25.00 | 0.00 |
| $Cu_{85}Ga_{15}$ | 85.00 | 15.00 | 0.00 | 85.00 | 15.00 | 0.00 |
| $Cu_9(Ga_{0.75}In_{0.25})_4$ | 9.00 | 3.00 | 1.00 | 69.23 | 23.08 | 7.69 |
| $Cu_{11}(Ga_{0.35}In_{0.65})_9$ | 11.00 | 1.4 | 2.6 | 55.00 | 15.75 | 29.25 |
| $Cu_{11}(Ga_{0.45}In_{0.55})_9$ | 11.00 | 1.8 | 2.2 | 55.00 | 20.25 | 24.75 |
| $Cu_{11}(Ga_{0.55}In_{0.45})_9$ | 11.00 | 2.2 | 1.8 | 55.00 | 24.75 | 20.25 |
| $Cu_{0.85}(Ga_{0.25}In_{0.75})$ | 0.85 | 0.25 | 0.75 | 45.95 | 13.51 | 40.54 |
| $Cu_{0.85}(Ga_{0.35}In_{0.65})$ | 0.85 | 0.35 | 0.65 | 45.95 | 18.92 | 35.14 |
| $Cu_{0.85}(Ga_{0.45}In_{0.55})$ | 0.85 | 0.45 | 0.55 | 45.95 | 24.32 | 29.73 |
| $Cu_{0.83}(Ga_{0.3}In_{0.7})$ | 0.83 | 0.30 | 0.70 | 45.36 | 16.39 | 38.25 |

In addition, chalcogenide-based compositions can also be included as possible target compositions for depositing chalcogenized layers along with the precursor layers. For example, as discussed above, $In_2S_3$ and $In_2Se_3$ targets can be utilized to deposit thermodynamically stable layers comprising $In_2S_3$ and $In_2Se_3$.

For deposition of Ag—In precursor layers, exemplary targets comprise Ag and In having the same compositions as for the precursor layers, i.e., 1) containing less than 21% In by weight, 2) 26-35 wt % In, or 3) $AgIn_2$. These compositions are illustrated in Table 2. The compositions are shown as wt % only. Due to the similar atomic weight of Ag and In, the wt % is approximately the same as the atomic %. Targets comprising Ag and In in other proportions can be used if the deposition from each target is controlled so as to deposit precursor layers of the desired compositions, as described above. Targets can be manufactured using conventional methods such as casting or pressing of (atomized) powders. Use of higher In-containing Ag—In alloys allows for less deposition of elemental indium, and can provide greater stability for the precursor layer stack as it is heated.

TABLE 2

Target compositions for Ag—In precursor layers

| Formula for composition | Ag | In | At. % Ag | At. % In |
|---|---|---|---|---|
| $Ag_{>0.79}In_{<0.21}$ | >0.79 | <0.21 | >79.0 | <21.0 |
| $Ag_{0.65-0.74}In_{0.26-.35}$ | 0.65-0.74 | 0.26-0.35 | 65.0-74.0 | 26.0-35.0 |
| $AgIn_2$ | 1 | 2.00 | 33.33 | 66.67 |

Table 3 illustrates examples of deposition configurations that may be used to produce Ag,Cu—In—Ga precursor films. Table 3 illustrates four examples of deposition configurations. Those skilled in the art will understand that other configurations are possible and would fall within the scope of the present invention.

TABLE 3

Deposition configurations

| ID | Deposition # 1 | Deposition # 2 | Deposition # 3 |
|---|---|---|---|
| 1 | Ag—In with less than 21 wt % In | Cu—Ga with Ga less than 45 wt % | In |
|   | Ag—In with 26-35 wt % In | Cu—Ga with Ga less than 45 wt % | In (optional) |
|   | $AgIn_2$ | Cu—Ga with Ga less than 45 wt % | In (optional) |
| 2 | Cu (In, Ga) | In | — |
| 3 | Cu | Cu—Ga | $In_2Se_3$ and/or $In_2S_3$ (inert atmosphere) |

In the configuration with ID=1, the first deposition is used to form a layer that is composed of less than 21 wt % In in Ag. This layer may also include other elements at lower concentrations so long as the material forms a stable phase. This layer may be formed using any one of PVD (sputtering), evaporation, plating, or other deposition methods discussed previously. The second deposition is used to form a layer that is primarily composed of Cu and Ga, with the Ga composition less than 45 wt %. This layer may also include other elements at lower concentrations. This layer may be formed using any one of PVD (sputtering), evaporation, plating, or other deposition methods discussed previously. Those skilled in the art will understand that the absorber material formed after the conversion to a chalcogenide and after the interdiffusion will advantageously be Cu poor. The third deposition is used to form a layer that is primarily composed of elemental indium. This layer may also include other elements at lower concentrations so long as the material forms a stable phase. This layer may be formed using any one of PVD (sputtering), evaporation, plating, or other deposition methods discussed previously. In some embodiments, the third deposition forms a layer that is primarily composed of $In_2Se_3$ and/or $In_2S_3$, for example, by performing the deposition using an In target in the presence of a chalcogen, or by using a target comprising $In_2Se_3$ and/or $In_2S_3$. Those skilled in the art will understand that the absorber material formed after the conversion to a chalcogenide and after the interdiffusion will advantageously be Cu poor.

In some embodiments, the first deposition is used to form a layer that is composed of 26-35 wt % In in Ag. This layer may also include other elements at lower concentrations so long as the material forms a stable phase. This layer may be formed using any one of PVD (sputtering), evaporation, plating, or other deposition methods discussed previously. The second deposition is used to form a layer that is primarily composed of Cu and Ga, with the Ga composition less than 45 wt %. This layer may also include other elements at lower concentrations. This layer may be formed using any one of PVD (sputtering), evaporation, plating, or other deposition methods discussed previously. Those skilled in the art will understand that the absorber material formed after the conversion to a chalcogenide and after the interdiffusion will advantageously be Cu poor. The third deposition is used to form a layer that is primarily composed of elemental indium. This layer may also include other elements at lower concentrations so long as the material forms a stable phase. This layer may be formed using any one of PVD (sputtering), evaporation, plating, or other deposition methods discussed previously. Those skilled in the art will understand that the absorber material formed after the conversion to a chalcogenide and after the interdiffusion will advantageously be Cu poor.

In some embodiments, the first deposition is used to form a layer that is composed of $AgIn_2$. This layer may also include other elements at lower concentrations so long as the material forms a stable phase. This layer may be formed using any one of PVD (sputtering), evaporation, plating, or other deposition methods discussed previously. The second deposition is used to form a layer that is primarily composed of Cu and Ga, with the Ga composition less than 45 wt %. This layer may also include other elements at lower concentrations. This layer may be formed using any one of PVD (sputtering), evaporation, plating, or other deposition methods discussed previously. Those skilled in the art will understand that the absorber material formed after the conversion to a chalcogenide and after the interdiffusion will advantageously be Cu poor. The third deposition is used to form a layer that is primarily composed of elemental indium. This layer may also include other elements at lower concentrations so long as the material forms a stable phase. This layer may be formed using any one of PVD (sputtering), evaporation, plating, or other deposition methods discussed previously. Those skilled in the art will understand that the absorber material formed after the conversion to a chalcogenide and after the interdiffusion will advantageously be Cu poor.

In the configuration with ID=2, the first deposition is used to form a layer that is composed of Cu(In,Ga) having a Cu-rich composition. That is, the Cu/(In+Ga) ratio is greater than about 2, and the Ga/(In+Ga) ratio is above 0.5. This layer may also include other elements at lower concentrations so long as the material forms a stable phase. This layer may be formed using any one of PVD (sputtering), evaporation, plating, or other deposition methods discussed previously. The second deposition is used to form a layer that is primarily composed of elemental In. This layer may also include other elements at lower concentrations so long as the material forms a stable phase. This layer may be formed using any one of PVD (sputtering), evaporation, plating, or other deposition methods discussed previously. In some embodiments, the second deposition forms a layer that is primarily composed of $In_2Se_3$ and/or $In_2S_3$, for example, by performing the deposition using an In target in the presence of a chalcogen, or by using a target comprising $In_2Se_3$ and/or $In_2S_3$. Those skilled in the art will understand that the absorber material formed after the conversion to a chalcogenide and after the interdiffusion will advantageously be Cu poor.

In the configuration with ID=3, the first deposition is used to form a layer that is primarily composed of elemental Cu. This layer may also include other elements at lower concentrations so long as the material forms a stable phase. This layer may be formed using any one of PVD (sputtering), evaporation, plating, or other deposition methods discussed previously. The second deposition is used to form a layer that is primarily composed of Cu—Ga. This layer may also include other elements at lower concentrations so long as the material forms a stable phase. This layer may be formed using PVD (sputtering) using a high Ga content target that has a Ga composition (Ga/(Ga+In)) in the range of about 0.25 to about 0.66 as discussed previously. The third deposition is used to form a layer that is primarily composed of $In_2Se_3$ and/or $In_2S_3$. This layer may also include other elements at lower concentrations so long as the material forms a stable phase. This layer may be formed using any one of PVD (sputtering), evaporation, plating, or other deposition methods discussed previously using an inert atmosphere. The third deposition can also be performed by PVD using an In target in the presence of a chalcogen, or by using a target comprising $In_2Se_3$ and/or $In_2S_3$. Those skilled in the art will understand that the absorber material formed after the conversion to a chalcogenide and after the interdiffusion will advantageously be Cu poor.

In the configuration with ID=4, the first deposition is used to form a layer that is primarily composed of elemental Cu. This layer may also include other elements at lower concentrations so long as the material forms a stable phase. This layer may be formed using any one of PVD (sputtering), evaporation, plating, or other deposition methods discussed previously. The second deposition is used to form a layer that is primarily composed of Cu—Ga. This layer may also include other elements at lower concentrations so long as the material forms a stable phase. This layer may be formed using PVD (sputtering) using a high Ga content target that has a Ga composition (Ga/(Ga+In)) in the range of about 0.25 to about 0.66 as discussed previously. The third deposition is used to form a layer that is primarily composed of $In_2Se_3$ and/or $In_2S_3$. This layer may also include other elements at lower concentrations so long as the material forms a stable phase. The third deposition can also be performed by PVD using an In target in the presence of a chalcogen, or by using a target comprising $In_2Se_3$ and/or $In_2S_3$. Those skilled in the art will understand that the absorber material formed after the conversion to a chalcogenide and after the interdiffusion will advantageously be Cu poor.

Those skilled in the art will understand that in each of the examples listed in Table 3, a portion of the Cu in any of the Cu-containing layers may be substituted with Ag so long as the material forms a stable phase. In some embodiments, a system similar to that illustrated in FIG. 8 may have two or more deposition stations, typically to deposit a first metal precursor film and a second layer rich in a bandgap-increasing metal.

In some embodiments, Na (or other Group-IA or Group-IIA elements) can be incorporated into the final absorber material. The Na (or other materials) can be incorporated into one or more of the metal targets or can be deposited as a separate layer. The Na (or other materials) can be deposited at the beginning of the deposition of the precursor layer(s), as an intermediate layer, or at the end of the deposition of the precursor layer(s).

In some embodiments, a capping layer (e.g. Se) can be deposited to protect the precursor layer(s) from the ambient environment prior to the chalcogenization step.

It is desirable to optimize the selenization of the metal precursor films by increasing the reaction temperature. At elevated temperatures, In agglomeration competes against selenization. Under conditions where In agglomeration occurs despite selenization, In particulates segregate from the metal precursor film and form separate binary phases. The resulting films have a spotty and blister-like visual appearance. X-ray diffraction (XRD) spectra on these films show InSe (004) and (006) peaks in addition to the ternary chalcopyrite phases. There is no photo-luminescence (PL) intensity on these films and device results are poor. To solve this problem, an intermediate, lower temperature selenization step at between about 300° C. and about 450° C. can be performed as described in U.S. patent application Ser. No. 13/595,730, incorporated by reference herein, to partially selenize the precursor film before complete selenization at higher temperatures. The additional step secures the indium in a selenized state to prevent agglomeration. This eliminates the problem of binary phase formation in the final selenization step.

Another problem typically encountered during selenization is the difficulty to control the degree of selenization at higher temperatures. The selenization reaction of CIGSe occurs at temperatures above about 350° C. if the Se source is $H_2Se$. In an exemplary batch furnace, the ramp rates are generally limited to about 10° C./min by hardware. Those skilled in the art will understand that parameters such as ramp rates and temperature uniformity within processing equipment depend on the details of the equipment and that exemplary values used herein are not limiting. If the furnace temperature is increased to 600° C., delamination at the Mo/CIGSe interface is observed due to over-selenization and formation of a thick $MoSe_2$ layer. In some embodiments of the present invention, a fast gas exchange step is introduced at the high temperature step to replace $H_2Se$ in the furnace with an inert gas such as Ar, $N_2$, etc. to stop further selenization. This resolves the delamination problem due to over-selenization by limiting the formation of the $MoSe_2$ layer. Details of the fast gas exchange process are described in U.S. patent application Ser. No. 13/283,225 entitled "Method of Fabricating CIGS by Selenization at High Temperature," filed on Oct. 27, 2011, herein incorporated by reference.

Figure 11:
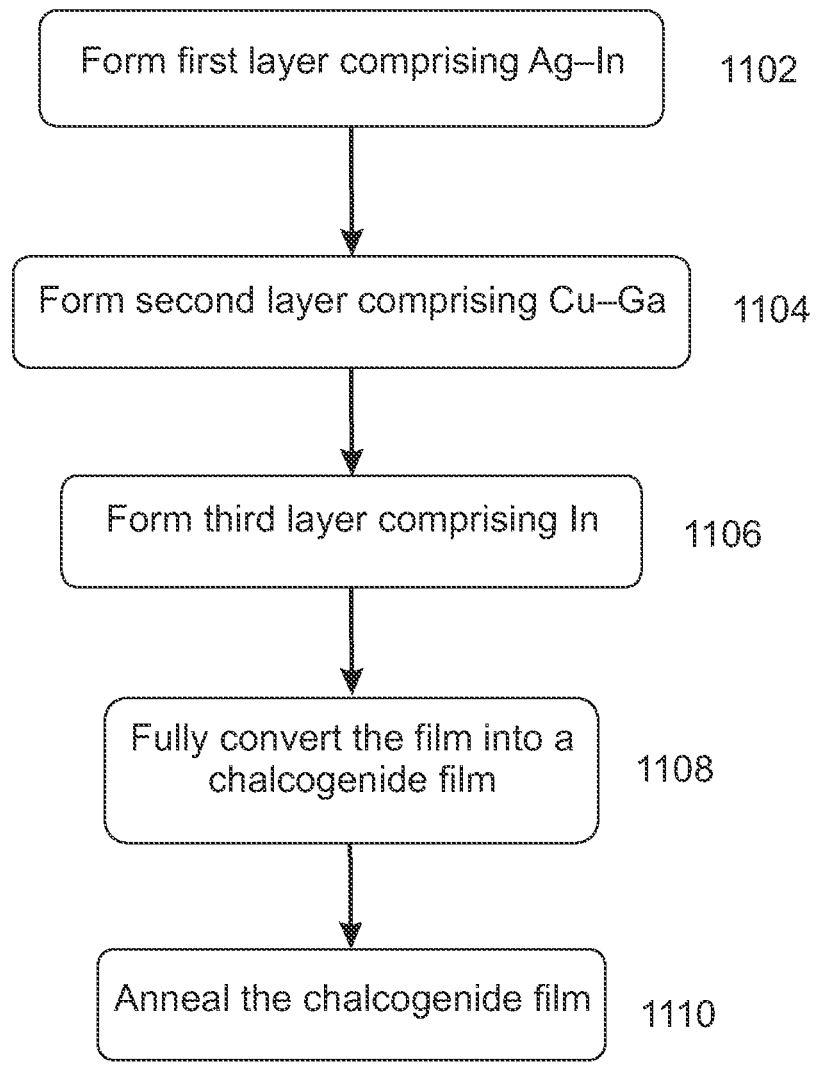
FIG. 11 is a flow chart for a method used to form an absorber material according to some embodiments.

FIG. 11 illustrates a flow chart that describes methods of some embodiments of the present invention. The purpose of the method is to form a Group I-III-VI semiconductor material suitable for thin film solar cells on a substrate. Examples of suitable substrates comprise float glass, low-iron glass, borosilicate glass, flexible glass, specialty glass for high temperature processing, stainless steel, carbon steel, aluminum, copper, titanium, molybdenum, polyimide, plastics, cladded metal foils, etc. Furthermore, the substrates may be processed in many configurations such as single substrate processing, multiple substrate batch processing, in-line continuous processing, roll-to-roll processing, etc. Those skilled in the art will understand that the substrate will have been exposed to several previous processing steps and will have several layers formed thereon before this step in the manufacture of a solar cell.

In step 1102, a first layer is formed above a surface of the substrate. In some embodiments, the first layer comprises Ag—In containing less than 21 wt % In. The first layer may be formed by any one of a variety of techniques. Examples of suitable techniques include batch or in-line (co)evaporation, batch or in-line PVD (sputtering), ALD, CVD, Plasma enhanced CVD (PECVD), Plasma enhanced ALD (PEALD), atmospheric pressure CVD (APCVD), ultra-fast atmospheric ALD, plating, printing or spraying of inks, screen printing, inkjet printing, slot die coating, gravure printing, or wet chemical depositions.

In step 1104, a second layer is formed above the first layer. In some embodiments, the second layer comprises Cu—Ga, with the Ga composition less than 45 wt %. Advantageously, the second layer is formed from one of the Cu—Ga target compositions discussed earlier in reference to Table 1. The second layer may be formed by any one of a variety of techniques. Examples of suitable techniques include batch or in-line (co)evaporation, batch or in-line PVD (sputtering), ALD, CVD, Plasma enhanced CVD (PECVD), Plasma enhanced ALD (PEALD), atmospheric pressure CVD (APCVD), ultra-fast atmospheric ALD, plating, printing or spraying of inks, screen printing, inkjet printing, slot die coating, gravure printing, or wet chemical depositions.

In step 1106, a third layer is formed above the second layer. In some embodiments, the third layer comprises In and is formed using PVD from an In target. In some embodiments, the third layer comprises $In_2Se_3$ and/or $In_2S_3$ formed by a batch or in-line PVD (sputtering) technique using reactive sputtering in a selenizing and/or sulfuring atmosphere. In some embodiments, the third layer comprises $In_2Se_3$ and/or $In_2S_3$ and is formed by a batch or in-line PVD (sputtering) using an $In_2Se_3$ and/or $In_2S_3$ target in an inert atmosphere. Examples of suitable techniques include batch or in-line (co) evaporation, batch or in-line PVD (sputtering), ALD, CVD, Plasma enhanced CVD (PECVD), Plasma enhanced ALD (PEALD), atmospheric pressure CVD (APCVD), ultra-fast atmospheric ALD, plating, printing or spraying of inks, screen printing, inkjet printing, slot die coating, gravure printing, or wet chemical depositions.

The forming steps can be repeated to form an absorber layer of desired thickness and composition. At this point, the three layers have formed a metal precursor film having stable layers. The finished atomic composition ratios can be described as $0.7<(Ag+Cu)/(In+Ga)<1.0$ and $0<Ga/(In+Ga)<0.4$. The metal precursor film is advantageously Cu-poor so that the absorber material will exhibit p-type behavior.

In step 1108, the metal precursor film is fully converted to a chalcogenide material. The converting step may be accomplished using one of a batch furnace, RTP system, or in-line system. In the case of a batch furnace, the chalcogenization can proceed in accordance with one or more temperature profiles.

Step 1110 illustrates an optional anneal to allow the interdiffusion of In and Ga within the film as discussed previously. This step may be integrated in the chalcogenization process or may be a separate step.

In some embodiments, a fourth layer that includes Ag is formed above the third layer before the chalcogenization step (e.g. between steps 1106 and 1108—not shown). The addition of Ag provides an additional mechanism for altering the bandgap grading and improving the performance of the device.

In some embodiments, the metal precursor film further includes Na. The Na may be added during any of the layer formation steps (i.e. steps 1102-1106—not shown) or may be added as a separate layer before the chalcogenization step as discussed previously.

In some embodiments, the method illustrated in FIG. 11 excludes the purposeful addition or exposure of the metal precursor film to a source of S. The addition of S complicates the chalcogenization of the metal precursor film and the formation of the chalcogenide material because of the introduction of a second reactant (S) in addition to the existing reactant (Se).

In some additional embodiments, the first layer comprises a greater amount of In in Ag. In some embodiments, the first layer comprises a Ag—In composition comprising from 26-35 wt.-% In. In some embodiments, the first layer comprises $AgIn_2$. The first layer may be formed by any one of a variety of techniques. Examples of suitable techniques include batch or in-line (co)evaporation, batch or in-line PVD (sputtering), ALD, CVD, Plasma enhanced CVD (PECVD), Plasma enhanced ALD (PEALD), atmospheric pressure CVD (APCVD), ultra-fast atmospheric ALD, plating, printing or spraying of inks, screen printing, inkjet printing, slot die coating, gravure printing, or wet chemical depositions.

Figure 12:
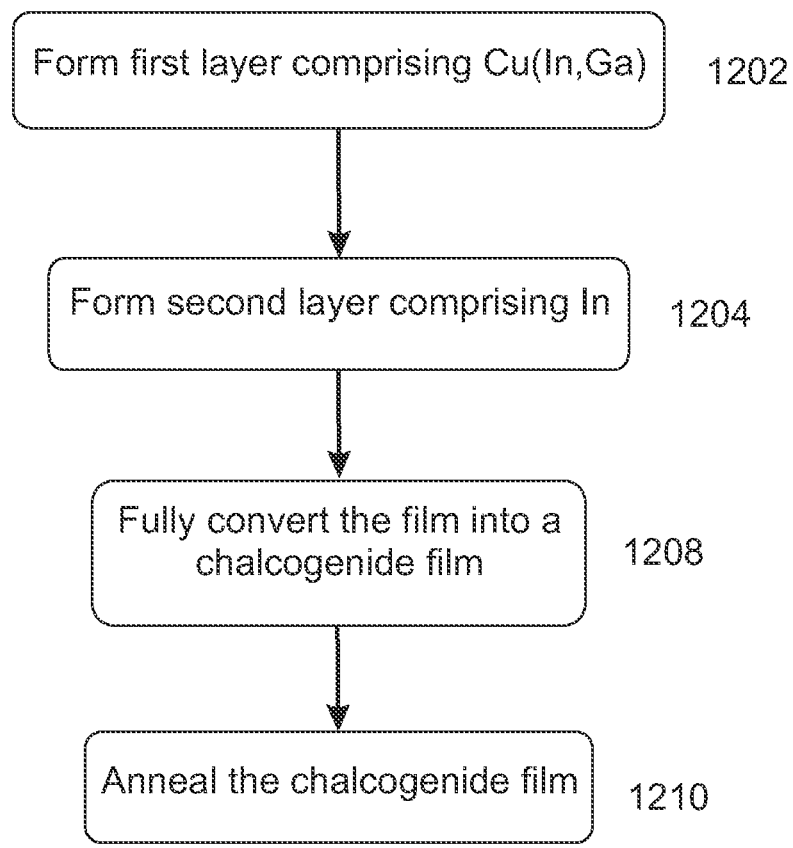
FIG. 12 is a flow chart for a method used to form an absorber material according to some embodiments.

FIG. 12 illustrates a flow chart that describes methods of some embodiments of the present invention. The purpose of the method is to form a Group I-III-VI semiconductor material suitable for thin film solar cells on a substrate. Examples of suitable substrates comprise float glass, low-iron glass, borosilicate glass, flexible glass, specialty glass for high temperature processing, stainless steel, carbon steel, aluminum, copper, titanium, molybdenum, polyimide, plastics, cladded metal foils, etc. Furthermore, the substrates may be processed in many configurations such as single substrate processing, multiple substrate batch processing, in-line continuous processing, roll-to-roll processing, etc. Those skilled in the art will understand that the substrate will have been exposed to several previous processing steps and will have several layers formed thereon before this step in the manufacture of a solar cell.

In step 1202, a first layer is formed above a surface of the substrate. In some embodiments, the first layer comprises Cu(In,Ga). That is, the Cu/(In+Ga) ratio is greater than about 2, and the Ga/(In+Ga) ratio is above 0.5. Advantageously, the first layer is formed from one of the Cu(In,Ga) target compositions discussed earlier in reference to Table 1. The first layer may be formed by any one of a variety of techniques. Examples of suitable techniques include batch or in-line (co) evaporation, batch or in-line PVD (sputtering), ALD, CVD, Plasma enhanced CVD (PECVD), Plasma enhanced ALD (PEALD), atmospheric pressure CVD (APCVD), ultra-fast atmospheric ALD, plating, printing or spraying of inks, screen printing, inkjet printing, slot die coating, gravure printing, or wet chemical depositions.

In step 1204, a second layer is formed above the first layer. In some embodiments, the second layer comprises In. The second layer may be formed by any one of a variety of techniques. Examples of suitable techniques include batch or in-line (co)evaporation, batch or in-line PVD (sputtering), ALD, CVD, Plasma enhanced CVD (PECVD), Plasma enhanced ALD (PEALD), atmospheric pressure CVD (APCVD), ultra-fast atmospheric ALD, plating, printing or spraying of inks, screen printing, inkjet printing, slot die coating, gravure printing, or wet chemical depositions.

The forming steps can be repeated to form an absorber layer of desired thickness and composition. At this point, the two layers have formed a metal precursor film having stable layers. The metal precursor film is advantageously Cu-poor so that the absorber material will exhibit p-type behavior.

In step 1208, the metal precursor film is fully converted to a chalcogenide material. The converting step may be accomplished using one of a batch furnace, RTP system, or in-line system. In the case of a batch furnace, a temperature profile can be used to effect chalcogenization process.

Step 1210 illustrates an optional anneal to allow the inter-diffusion of In and Ga within the film as discussed previously. This step may be integrated in the chalcogenization process (e.g. step 1208 as discussed previously) or may be a separate step.

In some embodiments, a third layer that includes Ag is formed above the second layer before the chalcogenization step (e.g. between steps 1204 and 1208—not shown). The addition of Ag provides an additional mechanism for altering the bandgap grading and improving the performance of the device.

In some embodiments, the metal precursor film further includes Na. The Na may be added during any of the layer formation steps (i.e. steps 1202-1204—not shown) or may be added as a separate layer before the chalcogenization step as discussed previously.

In some embodiments, the method illustrated in FIG. 12 excludes the purposeful addition or exposure of the metal precursor film to a source of S. As discussed previously, the addition of S complicates the chalcogenization of the metal precursor film and the formation of the chalcogenide material.

Figure 13:
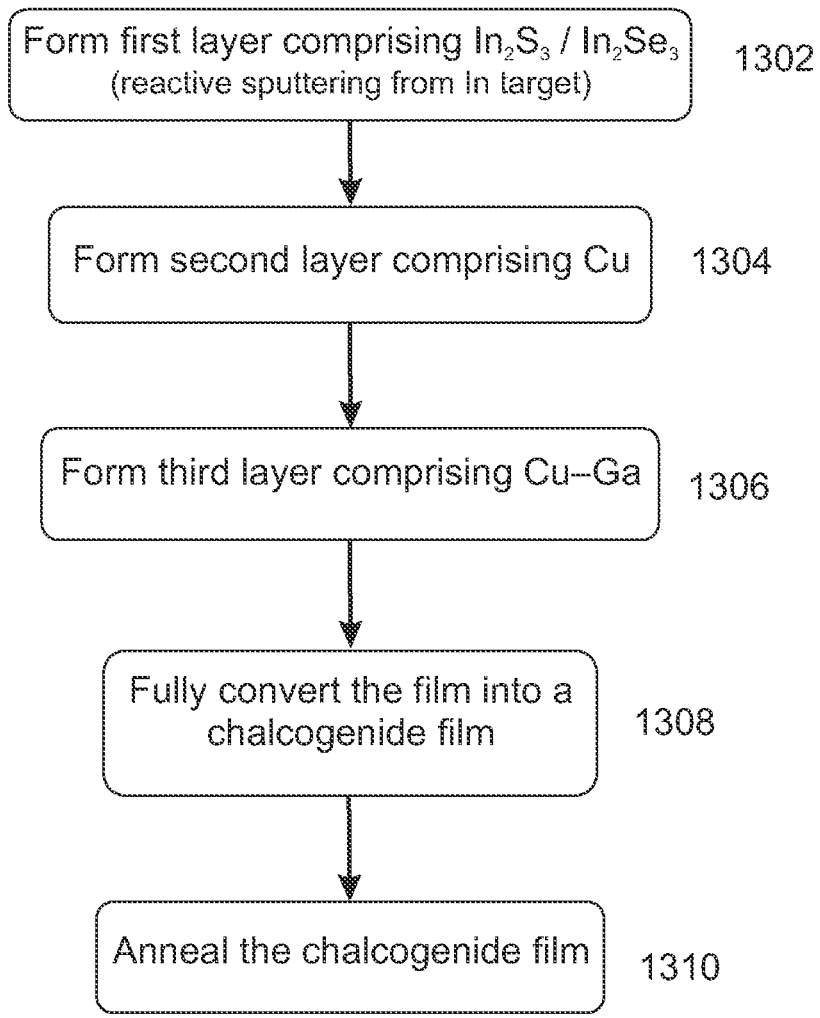
FIG. 13 is a flow chart for a method used to form an absorber material according to some embodiments.

FIG. 13 illustrates a flow chart that describes methods of some embodiments of the present invention. The purpose of the method is to form a Group I-III-VI semiconductor material suitable for thin film solar cells on a substrate. Examples of suitable substrates comprise float glass, low-iron glass, borosilicate glass, flexible glass, specialty glass for high temperature processing, stainless steel, carbon steel, aluminum, copper, titanium, molybdenum, polyimide, plastics, cladded metal foils, etc. Furthermore, the substrates may be processed in many configurations such as single substrate processing, multiple substrate batch processing, in-line continuous processing, roll-to-roll processing, etc. Those skilled in the art will understand that the substrate will have been exposed to several previous processing steps and will have several layers formed thereon before this step in the manufacture of a solar cell.

In step 1302, a first layer is formed above a surface of the substrate. In some embodiments, the first layer comprises $In_2Se_3$ and/or $In_2S_3$. The first layer may be formed by a batch or in-line PVD (sputtering) technique using reactive sputtering in a selenizing and/or sulfurizing atmosphere. The first layer is formed from an In target.

In step 1304, a second layer is formed above the first layer. In some embodiments, the second layer comprises Cu. The second layer may be formed by any one of a variety of techniques. Examples of suitable techniques include batch or in-line (co)evaporation, batch or in-line PVD (sputtering), ALD, CVD, Plasma enhanced CVD (PECVD), Plasma enhanced ALD (PEALD), atmospheric pressure CVD (APCVD), ultra-fast atmospheric ALD, plating, printing or spraying of inks, screen printing, inkjet printing, slot die coating, gravure printing, or wet chemical depositions.

In step 1306, a third layer is formed above second first layer. In some embodiments, the third layer comprises Cu—Ga. Advantageously, the first layer can be formed from one of the Cu—Ga target compositions discussed earlier in reference to Table 1. The third layer may be formed by any one of a variety of techniques. Examples of suitable techniques include batch or in-line (co)evaporation, batch or in-line PVD (sputtering), ALD, CVD, Plasma enhanced CVD (PECVD), Plasma enhanced ALD (PEALD), atmospheric pressure CVD (APCVD), ultra-fast atmospheric ALD, plating, printing or spraying of inks, screen printing, inkjet printing, slot die coating, gravure printing, or wet chemical depositions.

The forming steps can be repeated to form an absorber layer of desired depth and composition. At this point, the three layers have formed a metal precursor film having stable layers. The metal precursor film is advantageously Cu-poor so that the absorber material will exhibit p-type behavior.

In step 1308, the metal precursor film is fully converted to a chalcogenide material. The converting step may be accomplished using one of a batch furnace, RTP system, or in-line system. In the case of a batch furnace, a temperature profile can be used to effect the chalcogenization process.

Step 1310 illustrates an optional anneal to allow the inter-diffusion of In and Ga within the film as discussed previously. This step may be integrated in the chalcogenization process (e.g. step 1308 as discussed previously) or may be a separate step.

In some embodiments, a fourth layer that includes Ag can be formed above the third layer before the chalcogenization step (e.g. between steps 1306 and 1308—not shown). The addition of Ag provides an additional mechanism for altering the bandgap grading and improving the performance of the device.

In some embodiments, the metal precursor film further includes Na. The Na may be added during any of the layer formation steps (i.e. steps 1302-1306—not shown) or may be added as a separate layer before the chalcogenization step as discussed previously.

In some embodiments, the method illustrated in FIG. 13 excludes the purposeful addition or exposure of the metal precursor film to a source of S. As discussed previously, the addition of S complicates the chalcogenization of the metal precursor film and the formation of the chalcogenide material.

Figure 14:
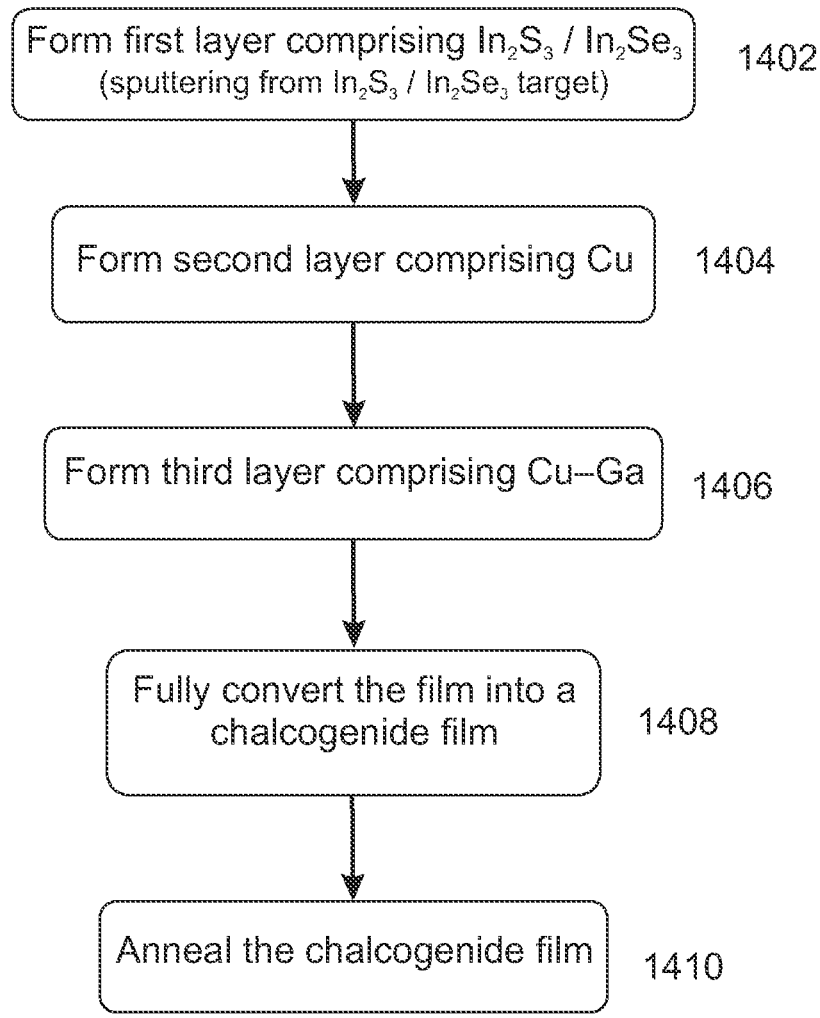
FIG. 14 is a flow chart for a method used to form an absorber material according to some embodiments.

FIG. 14 illustrates a flow chart that describes methods of some embodiments of the present invention. The purpose of the method is to form a Group I-III-VI semiconductor material suitable for thin film solar cells on a substrate. Examples of suitable substrates comprise float glass, low-iron glass, borosilicate glass, flexible glass, specialty glass for high temperature processing, stainless steel, carbon steel, aluminum, copper, titanium, molybdenum, polyimide, plastics, cladded metal foils, etc. Furthermore, the substrates may be processed in many configurations such as single substrate processing, multiple substrate batch processing, in-line continuous processing, roll-to-roll processing, etc. Those skilled in the art will understand that the substrate will have been exposed to several previous processing steps and will have several layers formed thereon before this step in the manufacture of a solar cell.

In step 1402, a first layer is formed above a surface of the substrate. In some embodiments, the first layer comprises $In_2Se_3$ and/or $In_2S_3$. The first layer may be formed by a batch or in-line PVD (sputtering) using an $In_2Se_3$ and/or $In_2S_3$ target in an inert atmosphere.

In step 1404, a second layer is formed above the first layer. In some embodiments, the second layer comprises Cu. The second layer may be formed by any one of a variety of techniques. Examples of suitable techniques include batch or in-line (co)evaporation, batch or in-line PVD (sputtering), ALD, CVD, Plasma enhanced CVD (PECVD), Plasma enhanced ALD (PEALD), atmospheric pressure CVD (APCVD), ultra-fast atmospheric ALD, plating, printing or spraying of inks, screen printing, inkjet printing, slot die coating, gravure printing, or wet chemical depositions.

In step 1406, a third layer is formed above the second layer. In some embodiments, the third layer comprises Cu—Ga. Advantageously, the third layer can be formed from one of the Cu—Ga target compositions discussed earlier in reference to Table 1. The third layer may be formed by any one of a variety of techniques. Examples of suitable techniques include batch or in-line (co)evaporation, batch or in-line PVD (sputtering), ALD, CVD, Plasma enhanced CVD (PECVD), Plasma enhanced ALD (PEALD), atmospheric pressure CVD (APCVD), ultra-fast atmospheric ALD, plating, printing or spraying of inks, screen printing, inkjet printing, slot die coating, gravure printing, or wet chemical depositions.

The forming steps can be repeated to form an absorber layer of desired thickness and composition. At this point, the three layers have formed a metal precursor film having stable layers. The metal precursor film is advantageously Cu-poor so that the absorber material will exhibit p-type behavior.

In step 1408, the metal precursor film is fully converted to a chalcogenide material. The converting step may be accomplished using one of a batch furnace, RTP system, or in-line system. In the case of a batch furnace, a temperature profile can be used to effect the chalcogenization process.

Step 1410 illustrates an optional anneal to allow the inter-diffusion of In and Ga within the film as discussed previously. This step may be integrated in the chalcogenization process (e.g. step 1308 as discussed previously) or may be a separate step.

In some embodiments, a fourth layer that includes Ag can be formed above the third layer before the chalcogenization step (e.g. between steps 1406 and 1408—not shown). The addition of Ag provides an additional mechanism for altering the bandgap grading and improving the performance of the device.

In some embodiments, the metal precursor film further includes Na. The Na may be added during any of the layer formation steps (i.e. steps 1402-1406—not shown) or may be added as a separate layer before the chalcogenization step as discussed previously.

In some embodiments, the method illustrated in FIG. 14 excludes the purposeful addition or exposure of the metal precursor film to a source of S. As discussed previously, the addition of S complicates the chalcogenization of the metal precursor film and the formation of the chalcogenide material.

Optical absorbers in solar cells and methods of forming optical absorbers are disclosed. An optical absorber is part of a thin film stack in a solar cell. The absorber layer is a CIGS(Se) semiconductor, formed from a precursor film stack which is chalcogenized. The precursor film comprises one or more thermodynamically stable layers comprising Cu, Ga, and In, wherein at least one layer comprises a layer rich in one or more of Cu and Ag, i.e., $(Cu+Ag)/(In+Ga)>0.5$, wherein the overall aggregate composition of the layers forming the precursor film is $0.7<(Ag+Cu)/(In+Ga)<1.0$, $0.0<Ag/(Cu+Ag)<0.3$, and $0.0<Ga/(In+Ga)<0.5$. In some embodiments, the overall composition of the layers forming the precursor film is $0.7<(Ag+Cu)/(In+Ga)<1.0$, $0.05<Ag/(Cu+Ag)<0.3$, and $0.0<Ga/(In+Ga)<0.5$. The composition of Cu, Ga, and In in each layer exhibits a single phase and the phase remains substantially constant in composition and laterally uniform in composition when heated above 155° C. The precursor film stack can comprise from one to ten or more layers with the precursor film stack typically ranging from 400 nm to 800 nm in thickness. Upon chalcogenization, the precursor film forms an optical absorber that is typically from 1.0 µm to 2.5 µm in thickness.

In some embodiments, the precursor film comprises a set of two or more layers, each layer exhibiting a thermodynamically stable single phase. In some embodiments, the precursor film comprises a set of two layers in each set of layers e.g., a stack of repeating layers, or a stack of non-repeating layers. In this embodiment, one layer comprises Cu, In, and Ga, where the atomic ratio of Cu to (In+Ga) in the layer comprising Cu, In, and Ga is greater than 2 and the atomic ratio of Ga to (Ga+In) is greater than 0.5, and the second layer comprises In. In another embodiment, one layer comprises Cu, In, and Ga, where the atomic ratio of Cu to (In+Ga) in the layer comprising Cu, In, and Ga is greater than 2 and the atomic ratio of Ga to (Ga+In) is greater than 0.5, and the second layer comprises an In chalcogenide (e.g., $In_2Se_3$ or $In_2S_3$). The layers in the precursor film can be present as layer pairs or can be deposited in any desired sequence to achieve a desired overall composition. If desired, one or more additional layers having a different composition can be deposited with the layer pairs to achieve a desired overall composition, or to provide grading through the thickness of the absorber layer.

In some embodiments, the precursor film comprises three layers in each set of layers, e.g., a stack of repeating layers, or a stack of non-repeating layers. In some embodiments, one layer of the stack comprises Ag and In, containing less than 21% In by weight, the second layer comprises Cu and Ga, and the third layer comprises In to provide a precursor film comprising Cu, Ga and In in the range of $0.7<(Ag+Cu)/(In+Ga)<1.0$, $0.05<Ag/(Cu+Ag)<0.3$, and $0.0<Ga/(In+Ga)<0.5$. In some embodiments, one layer of the stack comprises Ag and In, containing less than 21% In by weight, the second layer comprises Cu and Ga, and the third layer comprises $In_2Se_3$ or $In_2S_3$. The layers in the precursor film can be present as layer triplets or can be deposited in any desired sequence to achieve a desired overall composition. If desired, one or more additional layers having a different composition can be deposited with the layer triplets.

In some embodiments, the precursor film comprises three layers in each set of layers, wherein one layer comprises Cu and Ga, one layer comprises Cu, and one layer comprises In. In some embodiments, the precursor film comprises three layers in each set of layers, wherein one layer comprises Cu and Ga, one layer comprises Cu, and one layer comprises $In_2Se_3$ or $In_2S_3$. The layers in the precursor film can be present as layer triplets or can be deposited in any desired sequence to achieve a desired overall composition. If desired, one or more additional layers having a different composition can be deposited with the layer triplets.

When the precursor film stack comprises sets of two layers, the precursor film can be present as pairs of each layer, providing an overall composition for the precursor film which is an average of the composition of the two layers. The composition of the precursor film can be varied by adjusting the number of layers having each separate composition provided in the film. Similarly, when the precursor film comprises sets of three layers, the precursor film can be present as triplets of each layer, providing an overall composition for the precursor film which is an average of the composition of the three layers. The composition of the precursor film can be varied by adjusting the number of layers having each separate composition provided in the film or by adjusting the thickness of particular layers. For example, the embodiments described above can be provided in a range of In compositions, by providing In layers of variable thickness, or by providing additional In layers. Similarly, the In composition of the precursor film can be varied by reducing or increasing the thickness or number of layers comprising Cu and Ga.

In some embodiments, the layers in a set of layers do not necessarily follow any particular repeating pattern, and can be deposited as needed to provide a desired overall composition or to provide a desired gradient in composition through the thickness of the precursor film. In addition, the precursor film can vary in composition through the thickness by varying the composition, deposition order or thickness of individual layers in the set of layers, so long as each layer as deposited exhibits a single phase. Similarly, if desired, additional layers can be present so long as each layer as deposited exhibits a single phase.

In some embodiments, each layer exhibits a single phase in the deposited metal phase, wherein the metal phase further comprises an additional phase of alkali salt or other dopant or grading material. For example, a single phase metal layer (e.g., an In layer, or a single-phase Cu—Ga alloy layer) can be multi-phasic when including an alkali salts (e.g., sodium) where the alkali salt is part of a salt (e.g., NaF) embedded in the single-phase metal layer (e.g., In, or single-phase Cu—Ga). The alkali source can also be part of the single metal phase (e.g., a single-phase In—Na compound). Where the precursor film comprises chalcogenide layers (e.g., $In_2Se_3$ or $In_2S_3$), the chalcogenide can be present as a separate phase within a layer that exhibits a single phase in the deposited metal phase.

In some embodiments, the optical absorber can exhibit a graded bandgap formed by a singly graded or doubly graded distribution of Ag relative to (Cu+Ag) throughout the thickness of the absorber. This can be accomplished by tailoring the atomic ratio of Ag to (Cu+Ag) throughout the thickness of the precursor film comprised of one or more layers. It should be understood that depending on the subsequent processing conditions (e.g. selenization) the Ag/(Cu+Ag) depth profile of the final optical absorber might deviate from the initial Ag/(Cu+Ag) depth profile of the precursor film.

In some embodiments, the optical absorber can also exhibit a graded bandgap formed by a singly graded or doubly graded distribution of Ga to (Ga+In) throughout the thickness of the absorber. This can be accomplished by tailoring the atomic ratio of Ga to (In+Ga) throughout the thickness of the precursor film comprised of one or more layers. In addition, bandgap grading can be accomplished by tailoring the atomic ratio of Ag to (Cu+Ag) throughout the thickness of the precursor film comprised of one or more layers. In addition, bandgap grading can be accomplished by tailoring the alkali content (e.g. sodium) throughout the thickness of the precursor film comprised of one or more layers.

It should be understood that depending on the subsequent processing conditions (e.g., selenization), the Ga/(In+Ga) depth profile of the final optical absorber might deviate from the initial Ga/(In+Ga) depth profile of the precursor film. To prepare a solar cell, the precursor film is chalcogenized by exposure to heat in the presence of a chalcogen source, either as a film, vapor, or gas, typically the chalcogen source being Se and S, to form the optical absorber. Furthermore, the optical absorber in a solar cell can exhibit a graded bandgap formed by a singly graded or doubly graded distribution of Se and S through the thickness of the absorber. It should be understood that the final bandgap grading throughout the thickness of the optical absorber (compound semiconductor) is the result of the combination of various compositional depth profiles, being e.g., Ag/(Cu+Ag), Ga/(In+Ga), or S/(Se+S).

Methods for forming an optical absorber comprise depositing a plurality of thermodynamically stable layers exhibiting a single phase, wherein each layer comprises one or more of Cu, Ga, and In on a substrate, and heating the layers in the presence of a chalcogen source to effect a stoichiometrically relatively complete chalcogenization reaction. The depositing can be performed by any convenient method. Some suitable methods include physical vapor deposition (PVD or sputtering), evaporation, chemical vapor deposition (CVD), plasma enhanced CVD (PECVD), printing, wet coating, or plating. The heating step can be performed in a batch system or in an in-line system. The chalcogen source can be a film, a vapor, or a gas. A common chalcogen film is Se. A common chalcogen vapor is Se or S. A common chalcogen gas is based on $H_2Se$ or $H_2S$.

The methods can comprise depositing the layers as one or more sets of one or more layers. Each set of layers comprises at least two layers, and each layer in each set of layers comprises one or more of Cu, Ga, and In exhibiting a single phase. The roughness of each layer does not change significantly when heated to 155° C., although both density and roughness of the film can change upon heating. The average roughness of the precursor film after heating to 155° C. is less than 100 nm, and the min-max roughness is less than 350 nm, as measured in an area of 10 µm×10 µm. Each layer has a thickness (roughness) varying by no more than 10%. In some embodiments, each layer exhibits an average roughness of no more than ±~10 nm as measured in an area of 10 µm×10 µm. In some embodiments, a set of layers comprises two layers. In some embodiments, a set of precursor layers comprises three layers.

The plurality of layers (or sets of layers) form a precursor film from about 400 nm to about 800 nm in thickness, and the optical absorber can be formed by repeating the depositing steps as desired followed by a subsequent heat treatment in the presence of a chalcogen source. In some embodiments, the method comprises depositing from 1 to 10 sets of precursor layers to form the precursor film.

The overall composition of the precursor film has a composition defined by atomic ratios of (Cu+Ag)/(In+Ga)<1 and Ga/(In+Ga)<0.5. In some embodiments, the overall composition of the layers forming the precursor film is 0.7<(Ag+Cu)/(In+Ga)<1.0, and 0.0<Ga/(In+Ga)<0.5. In some embodiments, the overall composition of the layers forming the precursor film is 0.7<(Ag+Cu)/(In+Ga)<1.0, 0.05<Ag/(Cu+Ag)<0.3, and 0.0<Ga/(In+Ga)<0.5. The methods can comprise depositing any number of layers having varying thickness or composition, or varying the order of deposition, so long as each layer as deposited exhibits a single phase. Similarly, if desired, the method can comprise depositing additional layers so long as each layer as deposited exhibits a single phase.

In some embodiments, the methods comprise depositing one or more sets of two layers using two PVD targets selected from $Cu_2(In_xGa_{1-x})$, x=0.25, and In. The one or more sets of two layers are deposited using two PVD targets selected from Cu(In,Ga) and In, wherein the Cu(In,Ga) target has an atomic ratio of Cu to (In+Ga) greater than 2 and an atomic ratio of Ga to (Ga+In) greater than 0.5.

In some embodiments, the methods comprise depositing one or more sets of three layers using three PVD targets, wherein the first target contains Ag and In containing less than 21% In by weight, the second target contains Cu and Ga where the Cu and Ga target comprises less than 45% Ga by weight, and the third target contains elemental In, where the layers are deposited in an inert atmosphere. In some embodiments, the one or more sets of three layers can be deposited using three PVD targets, wherein the first target contains Ag and In containing less than 21% In by weight, the second target contains Cu and Ga where the Cu and Ga target comprises less than 45% Ga by weight, and the third target contains an In chalcogenide target, for example, $In_2(S,Se)_3$ with any ratio of S/(S+Se), $In_2Se_3$ and/or $In_2S_3$ targets, wherein the layers are deposited in an inert (e.g., vacuum) atmosphere. In some embodiments, the layers comprising Ag and In, and Cu and Ga are deposited in an inert atmosphere, and the layer comprising an In chalcogenide is deposited in an atmosphere comprising one or more of S and Se.

In some embodiments, the one or more sets of three layers are deposited using three PVD targets selected from a Cu and Ga alloy target, a Cu target, and an In chalcogenide target, for example, $In_2(S,Se)_3$ with any ratio of S/(S+Se), $In_2Se_3$ and/or $In_2S_3$ targets, wherein the layers are deposited in an inert (e.g., vacuum) atmosphere. In some embodiments, the one or more sets of three layers are deposited using three PVD targets selected from a Cu and Ga alloy target, a Cu target, and an In chalcogenide target, for example, $In_2(S,Se)_3$ with any ratio of S/(S+Se), $In_2Se_3$ and/or $In_2S_3$ targets, wherein the Cu and Ga alloy layers, and Cu layers are deposited in an inert atmosphere, and the In chalcogenide layer is deposited in an atmosphere comprising one or more of S and Se. In some embodiments, the one or more sets of three layers are deposited using three PVD targets selected from a Cu and Ga alloy target, a Cu target, and an elemental In target, wherein the layers comprising Cu and Ga and Cu are deposited in an inert atmosphere, and the layer comprising In is deposited in an atmosphere comprising one or more of S and Se. In addition, when depositing an In chalcogenide target, the depositing can be performed in a reactive atmosphere (e.g., in the presence of a chalcogen source).

In some embodiments, the bandgap is graded through the thickness of the absorber after heating the precursor film comprising the one or more sets of layers. The methods can further comprise grading the bandgap of the absorber layer. The bandgap can be graded by varying the ratio of Ag to (Cu+Ag), by varying the ratio of Ga to (Ga+In), or by varying the ratio of S to (S+Se) through the thickness of the plurality of layers of the precursor film.

In some embodiments, the methods for forming an optical absorber comprise designating a plurality of site-isolated regions on the substrate, depositing a plurality of layers comprising one or more of Cu, Ga, and In on a substrate using PVD to form a precursor film, heating the layers in a chalcogenizing atmosphere to effect a chalcogenization reaction, varying process parameters (e.g., PVD and annealing process parameters) among the plurality of site-isolated regions in a combinatorial manner, and characterizing each precursor film or optical absorber formed on the discrete SIRs, for example for phase changes or other parameters as temperature is increased. The process parameters can comprise one or more of wt % In in Ag—In target, wt % Ga in Cu—Ga target, wt % Cu in Cu—In—Ga target, wt % Ga in Cu—In—Ga target, wt % Cu, Ag, In, and Ga in deposited film or stack of layers, sputtering power, sputtering pressure, sputtering atmosphere composition (e.g., $O_2$, $H_2Se$ or $H_2$ in addition to Ar or other noble gas), sputtering time, substrate temperature, annealing temperature and time, annealing atmosphere composition, annealing pressure, number of sets of precursor layers, and co-deposition vs. sequential layer deposition. In some embodiments, the characterizing each precursor film or optical absorber comprises measuring a structure or performance parameter of the precursor film or optical absorber for each of the plurality of site-isolated regions. In some embodiments, the structure or performance parameter is one or more of crystallinity, grain size (distribution), lattice parameter, crystal orientation (distribution), matrix and minority composition, bandgap, bandgap grading, bulk bandgap, surface bandgap, efficiency, resistivity, carrier concentration, mobility, minority carrier lifetime, optical absorption coefficient, surface roughness, adhesion, thermal expansion coefficient, thickness, photoluminescence properties, surface photovoltage properties, haze, gloss, specular reflection, etc.

Solar cells including the optical absorber can further comprise a back electrode, a buffer layer, and a top electrode layer, wherein the absorber layer comprises one or more elements from Cu, and Ag, one or more from Ga, and In, and one or more of S and Se. Methods for forming a solar cell assembly further comprise depositing a back contact electrode, an optical absorber, a buffer layer, and a front contact electrode. An exemplary solar collector can be fabricated on a substrate such as soda lime glass or stainless steel or aluminum foil. (1) A first layer of 200-500 nm of Mo is deposited by PVD for use as a back contact electrode. (2) The metals for the absorber are then deposited by PVD in a second layer of 400-800 nm (more typically in the range of 500-700 nm) from two or three targets. (3) After the metals are deposited, a batch furnace or inline furnace is used to heat the layers in an Se and/or S containing atmosphere to form an $(AgCu)(InGa)(S,Se)_2$ absorber layer from the second layer. Typically, the finished layer thickness is 1.2-2.4 µm; i.e., the selenization/sulfurization of the metals expands the layer by close to a factor of three in thickness. (4) 30-70 nm of CdS are then deposited in a third layer to serve as an n-type buffer layer. (5) A fourth layer comprising a bilayer of ZnO/Al—ZnO is then deposited to serve as a top contact electrode.

In some embodiments, the order of layer deposition is reversed. The fourth layer can be deposited on the substrate followed by the third layer, and the second layer. The second layer is selenized, and then the first layer is deposited.

Various sputtering targets are described above. It is understood that the sputtering apparatus and method details can vary. The sputtering process can be AC or DC or pulsed DC. Co-sputtering from a plurality of targets simultaneously can be performed if the apparatus supports such a plurality of sputtering sources. Sequential sputtering from different targets can be employed to deposit multiple layers having varying compositions. Where metal layers are to be deposited, sputtering can generally be performed in an inert atmosphere such as Ar. Masking and aperturing schemes can be used to restrict deposition to a site-isolated region of a substrate. In general, any known variation on sputtering methods can be used with the novel target combinations as long as the available process controls can enable deposition of the target layer thicknesses and compositions.

While the above embodiments have been generally described as enabling the deposition of absorbers having substantially uniform composition both laterally and across the thickness, in some embodiments, it is desired to grade the bandgap across the thickness. Typically, the efficiency of the absorber can be increased by having a bandgap that is highest at the back electrode (the Mo layer) and that generally decreases across the thickness of the absorber. In some embodiments, a small increase near the front electrode can be added. The grading of the bandgap can be achieved by varying any of the relative compositions of elements from the same column of the periodic table: Ag vs. Cu, In vs. Ga, and/or S vs. Se. Some grading tends to occur due to migration during annealing (i.e., selenization/sulfurization). Ga, in particular, tends to migrate toward the back electrode to form a Ga gradient even if no such gradient exists before annealing. As such, the "correct" precursor layer configuration prior to annealing can require experimental testing against the actual bandgap grading after annealing.

It can be appreciated that there are numerous process variations to be optimized for maximizing the efficiency of a laterally uniform composition absorber. For graded-band-gap absorbers, there are even more variations that can be explored and optimized. These optimizations can be expedited using the High Productivity Combinatorial (HPC) techniques discussed above. While production solar panels are generally made with nominally uniform layer compositions across large device areas, it is time consuming and expensive to make large panels with each experimental process parameter variation. HPC techniques can be used to implement a large number of process parameter variations in site-isolated regions on a substrate and test each variation for desired absorber or precursor film performance characteristics. In the context of the novel PVD methods for making CIGS absorbers disclosed herein, the process parameters that can be varied in a combinatorial manner include: one or more of wt % In in Ag—In target, wt % Ga in Cu—Ga target, wt % Cu in Cu—In—Ga target, wt % Ga in Cu—In—Ga target, wt % Cu, Ag, In, and Ga in deposited film or stack of layers, sputtering power, sputtering pressure, sputtering atmosphere composition (e.g., $O_2$, $H_2Se$ or $H_2$ in addition to Ar or other noble gas), sputtering time, number of sets of layers, and co-deposition vs. sequential layer deposition.

It will be understood that the descriptions of one or more embodiments of the present invention do not limit the various alternative, modified and equivalent embodiments which may be included within the spirit and scope of the present invention as defined by the appended claims. Furthermore, in the detailed description above, numerous specific details are set forth to provide an understanding of various embodiments of the present invention. However, one or more embodiments of the present invention may be practiced without these specific details. In other instances, well known methods, procedures, and components have not been described in detail so as not to unnecessarily obscure aspects of the present embodiments.

What is claimed is:

1. A method of forming an optical absorber, the method comprising
   forming a precursor film on a substrate, wherein the forming comprises depositing a plurality of precursor layers, wherein each precursor layer comprises one or more of Cu, Ga, and In, and wherein each precursor layer exists in a single phase, wherein the depositing is performed using physical vapor deposition (PVD) using a plurality of PVD targets, wherein one of the plurality of PVD targets comprises Ag and In and a composition thereof comprises less than 21 wt. % In or 26-35 wt. % In; and
   forming the optical absorber by heating the precursor film in the presence of at least one chalcogen.

2. The method of claim 1, wherein the chalcogen comprises one or more of S or Se.

3. The method of claim 1, wherein an overall composition of the precursor layers has a composition defined by atomic ratios of ((Cu+Ag)/(In+Ga))<1 and (Ga/(In+Ga))<0.5.

4. The method of claim 1, wherein an overall composition of the precursor layers has a composition defined by atomic ratios of 0.7<(Ag+Cu)/(In+Ga)<1.0, 0.05<Ag/(Cu+Ag)<0.3, and 0.0<Ga/(In+Ga)<0.5.

5. The method of claim 1, wherein the plurality of precursor layers comprises one or more sets of two or three layers.

6. The method of claim 1, wherein at least one of the plurality of precursor layers further comprises K, Mg, or Ca.

7. The method of claim 6, wherein another of the plurality of PVD targets comprises Cu an Ga, and a further of the plurality of targets comprises In.

8. The method of claim 7, wherein the deposition using the PVD target comprising In is performed in the presence of a chalcogen, or the deposition using the PVD target comprising In is performed in an inert atmosphere and the target comprises $In_2Se_3$ or $In_2S_3$.

9. The method of claim 7, wherein the Cu and Ga target comprises less than 45 wt. % Ga.

10. The method of claim 7, further comprising grading a bandgap of the absorber layer by varying the atomic ratio of Ag to (Cu+Ag) through the thickness of the precursor film.

11. The method of claim 1, further comprising grading a bandgap of the absorber layer by varying a ratio of Ga to (Ga+In) through a thickness of the plurality of precursor layers.

12. The method of claim 1, further comprising grading a bandgap of the absorber layer by varying a ratio of S to (S+Se) through a thickness of the plurality of layers after the heating.

* * * * *